(12) United States Patent
Jinbo et al.

(10) Patent No.: US 6,518,210 B1
(45) Date of Patent: Feb. 11, 2003

(54) EXPOSURE APPARATUS INCLUDING SILICA GLASS AND METHOD FOR PRODUCING SILICA GLASS

(75) Inventors: Hiroki Jinbo, Kawasaki; Norio Komine, Sagamihara; Hiroyuki Hiraiwa, Yokohama, all of (JP)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/593,441

(22) Filed: Jun. 14, 2000

Related U.S. Application Data

(62) Division of application No. 08/581,017, filed on Jan. 3, 1999, now Pat. No. 6,087,283.

(30) Foreign Application Priority Data

| Jan. 6, 1995 | (JP) | ............................................. 7-000479 |
| Jan. 13, 1995 | (JP) | ............................................. 7-004077 |

(51) Int. Cl.[7] .................................................. C03C 3/06
(52) U.S. Cl. ........................ 501/54; 423/336; 359/355; 359/642
(58) Field of Search ........................... 501/54; 423/336; 359/355, 642

(56) References Cited

U.S. PATENT DOCUMENTS

| 5,086,352 | A | * | 2/1992 | Yamagata et al. ........... 359/350 |
| 5,315,685 | A | * | 5/1994 | Fabian et al. ................ 385/142 |
| 5,325,230 | A | * | 6/1994 | Yamagata et al. ........... 359/350 |
| 5,349,456 | A | * | 9/1994 | Iwanaga et al. ............... 501/54 |
| 5,364,433 | A | * | 11/1994 | Nishimura et al. ............ 501/54 |
| 5,410,428 | A | * | 4/1995 | Yamgata et al. ............... 501/53 |
| 5,668,067 | A | * | 9/1997 | Araujo et al. ................. 501/54 |
| 5,679,125 | A | * | 10/1997 | Hiraiwa et al. ............... 65/397 |
| 5,707,908 | A | * | 1/1998 | Komine et al. ................ 501/54 |

FOREIGN PATENT DOCUMENTS

| EP | 0 401 845 | 12/1990 |
| EP | 0 483 752 | 5/1992 |
| EP | 0 557 587 | 9/1993 |
| JP | 404342436 | * 11/1992 |
| JP | 407267674 | * 10/1995 |
| JP | 407306426 | * 11/1995 |

OTHER PUBLICATIONS

Patent Abstracts of Japan, vol. 17, No. 108 (JP–A–04 295018), Mar. 5, 1993.

* cited by examiner

*Primary Examiner*—Karl Group
(74) *Attorney, Agent, or Firm*—Pennie & Edmonds LLP

(57) ABSTRACT

A silica glass has a structure determination temperature of 1200 K or lower and an OH group concentration of at least 1,000 ppm. The silica glass is used for photolithography together with light in a wavelength region of 400 nm or shorter.

9 Claims, 12 Drawing Sheets

EXPOSURE APPARATUS INCLUDING SILICA GLASS AND METHOD FOR PRODUCING SILICA GLASS

This application is a divisional application of U.S. patent application Ser. No. 08/581,017, filed Jan. 3, 1996, now U.S. Pat. No. 6,087,283.

BACKGROUND OF THE INVENTION

1. Field of the Invention

The present invention relates to a silica glass for photolithography, optical members including the glass, an exposure apparatus including the same, and a method for producing the glass. More particularly, it relates to a silica glass used in photolithography techniques together with light in a wavelength region of 400 nm or shorter or, more preferably, 300 nm or shorter, optical members such as lens and mirror including the glass, an exposure apparatus including the glass, and a method for producing the glass.

2. Related Background Art

In recent years, VLSI has been produced with a higher integration and a higher functionality. Particularly, in the field of logical VLSI, a larger system has been mounted on a chip, namely, system-on- chip technique has been in progress. In conjunction with such a trend, there is a demand for finer processability and higher integration on a wafer, such as that made of silicon, which constitutes a substrate for VLSI. In photolithography techniques according to which fine patterns of integrated circuits are exposed to light and transferred onto wafers such as of silicon, exposure apparatuses called stepper are used.

In the case of DRAM, as an example of VLSI, with the advance from LSI to VLSI, as its capacity gradually increases from 1 KB through 256 KB, 1 MB, 4 MB, and 16 MB to 64 MB, the processing line width required for the stepper correspondingly becomes finer from 10 μm through 2 μm, 1 μm, 0.8 μm, and 0.5 μm to 0.3 μm.

Accordingly, it is necessary for a projection lens of the stepper to have a high resolution and a great depth of focus. The resolution and the depth of focus are determined by the wavelength of the light used for exposure and the N.A. (numerical aperture) of the lens.

The angle of the diffracted light becomes greater as the pattern is finer, whereas the diffracted light cannot be captured when the N.A. of the lens becomes greater. Also, the angle of the diffracted light becomes smaller in the same pattern as its exposure wavelength A is shorter, thereby allowing the N.A. to remain small.

The resolution and the depth of focus are expressed as indicated by the following equations:

resolution=$k1 \cdot \lambda/N.A.$ depth of focus=$k2 \cdot \lambda/N.A.^2$ wherein k1 and k2 are constants of proportionality.

In order to improve the resolution, either the N.A. is increased or λ is shortened. However, as can be seen from the above equations, it is advantageous, in terms of the depth of focus, to shorten λ. In view of these points of view, wavelength of light sources becomes shorter from g-line (436 nm) to i-line (365 nm) and further to KrF excimer laser beam (248 nm) and ArF excimer laser beam (193 nm).

Also, since the optical system loaded in the stepper is constituted by a combination of numerous optical members such as lenses, even when each lens sheet has a small transmission loss, such a loss is multiplied by the number of the lens sheets used, thereby decreasing the amount of light at the irradiated surface. Accordingly, it is necessary for the optical member to have a high degree of transmittance.

Therefore, in the steppers using light in a wavelength region of 400 nm or shorter, optical glass made by a specific method in view of the shortening of wavelength as well as the transmission loss due to the combination of the optical members is used. Also, in the steppers using light in a wavelength region of 300 nm or shorter, it has been proposed to use synthetic silica glass and a fluoride single crystal such as CaF, (fluorite).

As a specific method for measuring internal transmittance, for example, a method of measuring transmittance of optical glass is known from JOGIS 17-1982. Here, the internal transmittance is calculated by the following equation:

$$\log \tau = -\frac{\log T1 - \log T2}{\Delta d} \times 10 \quad (1)$$

wherein τ is internal transmittance of the glass when its thickness is 10 mm; d is difference in thickness of a sample; and T1 and T2 are spectral transmission factors of the glass having sample thickness values of 3 mm and 10 mm, respectively, including their reflection loss.

SUMMARY OF THE INVENTION

However, the inventors have found that, in the optical members composed of the conventional silica glass whose internal transmittance is defined in this manner, although a certain magnitude of the resolution is secured in terms of their specification, contrast of an image resulting therefrom may be so unfavorable that a sufficiently vivid image cannot be obtained.

Here, the contrast is defined by the following equation:

$$\text{contrast} = \frac{I\max - I\min}{I\max + I\min} \quad (2)$$

wherein Imax is maximum value of optical intensity on a wafer surface and Imin is minimum value of the optical intensity on the wafer surface.

The object of the invention is to provide a silica glass for photolithography which can overcome the foregoing shortcomings of the prior art and can realize a sufficiently fine and vivid exposure and transfer pattern with a favorable contrast.

Accordingly, the inventors have studied, among the transmission loss factors in the silica glass (optical member) used for photolithography techniques and the like, factors for decreasing the contrast of image. As a result, it has been found that not only the optical absorption at the silica glass but also its optical scattering causes the transmission loss and that the amount of loss in light based on such optical scattering (scattering loss amount) can be sufficiently suppressed when the structure determination temperature in the silica glass containing at least a predetermined amount of OH group is reduced at least to a predetermined level. Thus, the present invention has been accomplished.

The silica glass (fused silica, quartz glass) of the present invention is used for photolithography together with light in a wavelength region of 400 nm or shorter and is characterized in that it has a structure determination temperature of 1,200 K or lower and an OH group concentration of at least 1,000 ppm.

Further, the optical member (optical component) of the present invention is an optical member used for photolithography together with light in a wavelength region of 400 nm or shorter and is characterized in that it includes the above-mentioned silica glass of the present invention.

Furthermore, the exposure apparatus (exposing device) of the present invention is an exposure apparatus which uses light in a wavelength region of 400 nm or shorter as exposure light and is characterized in that it is provided with the optical member including the above-mentioned silica glass of the present invention.

Moreover, the method for producing the silica glass in accordance with the present invention is characterized in that it comprises the steps of heating a silica glass ingot having an OH group concentration of at least 1,000 ppm to a temperature of 1,200 to 1,350 K, maintaining the ingot at that temperature for a predetermined period of time, and then cooling the ingot to a temperature of 1,000 K or lower at a temperature-lowering rate (cooling rate) of 50 K/hr or less to anneal the ingot, whereby making it possible to produce a silica glass having a structure determination temperature of 1,200 K or lower and an OH group concentration of at least 1,000 ppm.

The "structure determination temperature" herein used is a factor introduced as a parameter which expresses structural stability of silica glass and will be explained in detail below. The fluctuation in density of silica glass at room temperature, namely, structural stability is determined by density of the silica glass in the state of melt at high temperatures and density and structure of the silica glass when the density and the structure are frozen at around the glass transition point in the process of cooling. That is, thermodynamic density and structure corresponding to the temperature at which the density and structure are frozen are also retained at room temperature. The temperature when the density and structure are frozen is defined to be "structure determination temperature" in the present invention.

The structure determination temperature can be obtained in the following manner. First, a plurality of silica glass test pieces are retained at a plurality of temperatures within the range of 1073–1700 K for a period longer than the structure relaxation time (a time required for the structure of the silica glass being relaxed at that temperature) in the air in a tubular oven as shown in the accompanying FIG. 1, thereby to allow the structure of the respective test pieces to reach the structure at the retention temperature. As a result, each of the test pieces has a structure which is in the thermal equilibrium state at the retention temperature. In FIG. 1, 101 indicates a test piece, 102 indicates a silica glass tube, 103 indicates a heater, 104 indicates a thermocouple, 105 indicates a beaker, and 106 indicates liquid nitrogen.

Then, the test pieces are introduced not into water, but into liquid nitrogen in 0.2 second to quench them. If they are introduced into water, quenching is insufficient and structural relaxation occurs in the process of cooling, and the structure at the retention temperature cannot be fixed. Moreover, it can be considered that adverse effect may occur due to the reaction between water and the silica glass. In the present invention, super-quenching can be attained by introducing the test pieces into liquid nitrogen as compared with introduction into water, and by this operation, it becomes possible to fix the structure of the test pieces to the structure at the retention time. In this way, for the first time, the structure determination temperature can be allowed to coincide with the retention temperature.

The thus obtained test pieces having various structure determination temperatures (equal to the retention temperatures here) are subjected to measurement of Raman scattering, and 606 $cm^{-1}$ line intensity is obtained as a ratio to 800 $cm^{-1}$ line intensity. A graph is prepared with employing as a variable the structure determination temperature for 606 $cm^{-1}$ line intensity and this is used as a calibration curve. A structure determination temperature of a test piece of which the structure determination temperature is unknown can be inversely calculated from the measured 606 $cm^{-1}$ line intensity using the calibration curve. In the present invention, a temperature obtained in the above manner on a silica glass the structure determination temperature of which is unknown is employed as the structure determination temperature of the silica glass.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
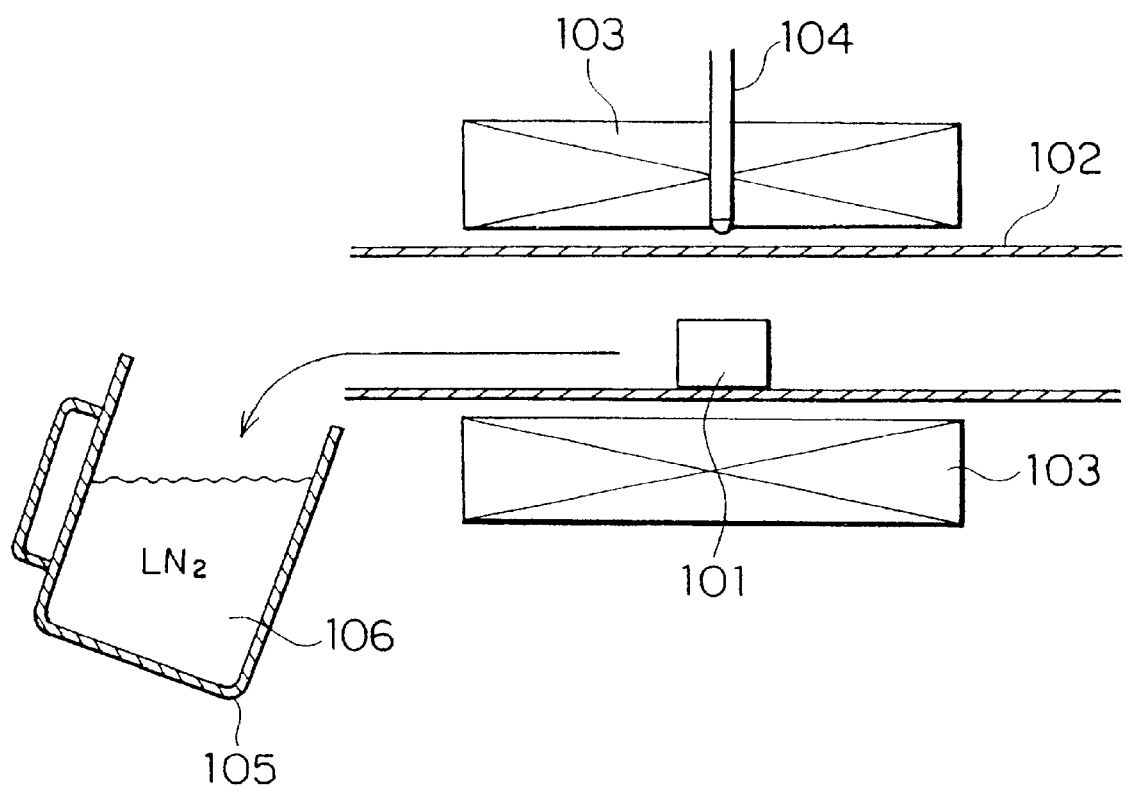
FIG. 1 is a schematic view showing an example of an apparatus used for measuring the structure determination temperature in accordance with the present invention.

First, the silica glass in accordance with the present invention will be explained.

The silica glass in accordance with the present invention is used for photolithography together with light in a wavelength region of 400 nm or shorter and is characterized in that it has a structure determination temperature of 1,200 K or lower and an OH group concentration of at least 1,000 ppm and preferably within the range of 1,000 to 1300 ppm.

In this manner, when the structure determination temperature of 1,200 K or lower and the OH group concentration of at least 1,000 ppm are specified, a silica glass having a low scattering loss amount, such as a scattering loss amount of 0.2%/cm or less with respect to ArF excimer laser, which cannot have been achieved conventionally, can be obtained, thereby sufficiently preventing the contrast from decreasing due to flare and ghost resulting from scattering light.

In general, optical energy impinging on an object generates a scattering phenomenon. The scattering phenomenon can be roughly divided into elastic scattering such as Rayleigh scattering and Brillouin scattering and inelastic scattering such as Raman scattering. In particular, when the scattering intensity in an optical member is high, the scattering light therefrom becomes flare or ghost so as to decrease the contrast of the image, thereby causing the optical characteristic to deteriorate.

The optical scattering, however, has been considered to be sufficiently less influential than the lowering of the resolution caused by change in the form or refractive index of the optical member upon optical absorption and at a level which can be practically neglected. Actually, in optical instruments using light in the visible region, the main cause for transmission loss is optical absorption and, accordingly, when its optical absorption is set to a level not higher than a certain level, a desirable resolution is satisfied together with a favorable contrast in the image.

The inventors, however, have found that, the optical scattering can become less negligible as the wavelength of the incident light has a shorter wavelength, so that, in particular, in the conventional optical members such as projection lens used for photolithography, a vivid image cannot be obtained due to flare and ghost resulting from the scattering light.

Though there has not been definitely elucidated mechanism by which the scattering loss with respect to ArF excimer laser is remarkably suppressed when at least 1,000 ppm of OH group are introduced into a silica glass having a structure determination temperature of 1,200 K or less, i.e., a silica glass having nearly an ideal structure, the inventors consider as explained in the following. Meanwhile, the structure determination temperature of the silica glass in accordance with the present invention is quite lower than that of optical fibers, for example, which is typically about 1,450 K.

The silica glass having a high structure determination temperature is considered to be structurally unstable. Namely, the bond angle of $\equiv$Si—O—Si$\equiv$ in the network of silica glass has a certain distribution because of it being a glass and this distribution of the bond angle includes structurally unstable bond angles. This distribution of the bond angle comprises bridged tetrahedrons made of oxygen atoms and silicon atoms in the silicon glass and the presence of the unstable bond angles is considered to be caused by the presence of the tetrahedrons in a distorted state. Such a distorted bond portion is considered to be readily cut by irradiation with ultraviolet light to produce the defects such as detrimental E' center and NBOHC. On the other hand, the silica glass having a low structure determination temperature is considered to have few such distorted bond portions.

Also, the silica glass having an OH group iS concentration within the above-mentioned range is structurally more stable than other kinds of silica glass and its structure determination temperature tends to become lower.

The detailed reasons therefor are as follows. Namely, as mentioned above, the $\equiv$Si—O—Si$\equiv$ bond angle in the network of silica glass has a certain distribution because of it being a glass and it contains structurally unstable distorted bond portions. However, when OH group within the above-mentioned range is contained therein, there is no need to make bridges using unstable bond angle and, accordingly, the tetrahedron can approximate its most stable structure.

Therefore, the silica glass containing OH group within the above-mentioned range is structurally more stable than other kinds of silica glass and its structure determination temperature tends to become lower.

Accordingly, in the silica glass in accordance with the present invention in which the OH group concentration is at least 1,000 ppm and the structure determination temperature is 1,200 K or lower, due to their synergistic effect, the scattering loss amount of 0.2%/cm or less is attained with respect to ArF excimer laser.

Preferably, the silica glass in accordance with the present invention has a fluorine content of at least 300 ppm. This is because, under the same annealing condition, the structure determination temperature tends to become lower when the fluorine content is at least 300 ppm.

Further, the total amount of optical scattering and optical absorption, namely, the transmission loss amount, influences the light amount on the reticle and wafer, thereby influencing the decrease in throughput due to the decrease in illumination intensity or the like. In particular, in the photolithography optical system, since its resolution is maximized to the limit, the number of lens sheets for correcting various kinds of wave front aberrations is large and its optical length is long. Accordingly, even a minute transmission loss amount (scattering loss amount plus absorption loss amount) may become influential. For example, in the optical path length of 1 m, even when the transmission loss amount is only 0.2%/cm, the total transmission loss amount becomes about 18%.

Therefore, in the silica glass in accordance with the present invention, the internal absorptivity in the silica glass having a thickness of 10 mm with respect to ArF excimer laser is preferably 0.2%/cm or less. This kind of optical absorption is a cause for decreasing the resolution as will be explained in the following. Namely, optical absorption is a phenomenon resulting from electronic transition caused by photon energy impinging on an optical member. When optical absorption occurs in the optical member, its energy is mainly converted into thermal energy, thereby inflating the optical member or changing its refractive index or surface condition. As a result, high resolution cannot be obtained. Further, the optical absorption is accompanied by change in electronic condition and, during the period by which it is relaxed, light having a longer wavelength than that of the incident light is released as fluorescence. When the fluorescence has a wavelength similar to that of exposure light and its intensity is high, the contrast of the image is remarkably decreased. Accordingly, in order to obtain a fine and vivid image with a favorable contrast, it is preferable to specify the absorption loss amount together with the scattering loss amount.

Also, as factors for deteriorating the ultraviolet light resistance of silica glass, there have been known, for example, $\equiv$Si—Si$\equiv$, $\equiv$Si—O—O—Si$\equiv$, and dissolved oxygen molecules. These precursors are readily converted into structural defects such as E' center and NBOHC upon exposure to ultraviolet light such as excimer laser, thereby causing the transmittance to decrease. In the silica glass in accordance with the present invention, it is preferable that there are no incomplete structures caused by such a deviation from the stoichiometric ratio. For example, when OH group within the above-mentioned range is contained therein, the silica glass tends to contain substantially no oxygen-shortage type defect absorption bands (7.6- and 5.0-eV absorption bands). Also, when the silica glass in accordance with the present invention containing at least $5 \times 10^{16}$ molecules/cm$^3$ of hydrogen molecules is irradiated with $1 \times 10^6$ pulses of ArF excimer laser at a one-pulse energy density of 100 mJ/cm$^2$, substantially no oxygen-excess type defect absorption band (4.8-eV absorption band) is generated. Due to the absence of these defects, according to measurement of transmittance effected by vacuum ultraviolet, ultraviolet, visible, and infrared spectrophotometers, high transmittance ratios of at least 99.9% in terms of internal transmittance (for silica glass having a thickness of 10 mm) for the light of the wavelength of g-line (436 nm) to i-line (365 nm) and KrF excimer laser beam (248 nm) and at least 99.6% in terms of internal transmittance (for silica glass having a thickness of 10 mm) for the light of the wavelength of ArF excimer laser beam (193 nm). Also, after being irradiated with $1 \times 10^6$ pulses of KrF excimer laser at an average one-pulse energy density of 400 mJ/cm$^2$, the internal transmittance of the above-mentioned silica glass having a thickness of 10 mm exceeds 99.5% with respect to the light having a wavelength of 248 nm. On the other hand, after being irradiated with $1 \times 10^6$ pulses of ArF excimer laser at an average one-pulse energy density of 100 mJ/cm$^2$, the internal transmittance of the above-mentioned silica glass having a thickness of 10 mm exceeds 99.5% with respect to the light having a wavelength of 193 nm.

Also, it is desirable for the structure determination temperature distribution in the silica glass of the present invention to have a center symmetry within the member since this will render a center symmetry to its scattering loss characteristic (scattering intensity). In this case, it becomes easy to specify, at the time of adjusting a lens, lens parts which may cause flare or ghost, thereby facilitating the optical adjustment. Further, the contrast can be prevented from fluctuating on the image-forming surface. Moreover, the silica glass of the present invention preferably has a birefringence amount of 2 nm/cm or less and centrally symmetrical polarization and birefringence characteristics.

In the silica glass of the present invention, the chlorine concentration is preferably 50 ppm or less and, in particular, 10 ppm or less. This is because, when the chlorine concentration exceeds 50 ppm, it tends to become difficult for the OH group concentration in the silica glass to be maintained at 1,000 ppm or higher.

Also, the silica glass preferably has a high quality such that its concentration of each of metallic impurities (Mg, Ca, Ti, Cr, Fe, Ni, Cu, Zn, Co, Mn, Na and K) is 50 ppb or less and more preferably 20 ppb or less. In this case, the above-mentioned structural defects decrease to form a structure approximating the ideal structure and also the change in refractive index, change in surface, and deterioration of transmittance caused by the metallic impurities become lower such that the ultraviolet light resistance tends to improve.

In the following, the optical member and exposure apparatus of the present invention will be explained. The optical member of the present invention includes the above-mentioned silica glass of the present invention in which the structure determination temperature is 1,200 K or less and the OH group concentration is at least 1,000 ppm. Such an optical member has no particular limitation, as long as it includes the above-mentioned silica glass, and may be such an optical member as lens or prism which is used together with light in a wavelength region of 400 nm or shorter. The optical member of the present invention includes blank. Further, the method for processing the above-mentioned silica glass of the present invention into the optical member of the present invention is not restricted in particular, while normal cutting method or abrasion method, for example, may be appropriately used.

Since the optical member of the present invention includes a silica glass which, as mentioned above, exhibits a very small scattering loss amount with respect to light of a short wavelength such as ArF excimer laser beam, as compared with the conventional optical members, the scattering light is more effectively prevented from generating and it exhibits a higher resolution. Accordingly, the silica glass of the present invention is suitably applied to an optical member such as a lens in a projection optical system of steppers which requires such a high resolution as 0.25 μm or less. The silica glass of the present invention is useful not only for lenses in the projection system of the stepper but also for lenses in illumination optical systems, for example.

An exposure apparatus of the present invention will be described next. The exposure apparatus of the present invention is provided with the optical member comprising the silica glass of the present invention and uses light in the wavelength region of 400 nm or shorter as exposure light, and has no limitation except that it contains the silica glass as a lens of illumination optical system, projection optical system, or the like, and is provided with a light source for emitting light in the wavelength region of 400 nm or shorter.

The present invention is preferably applied to the projection exposure apparatus, such as a so-called stepper, for projecting an image of patterns of reticle onto a wafer coated with a photoresist.

Figure 2:
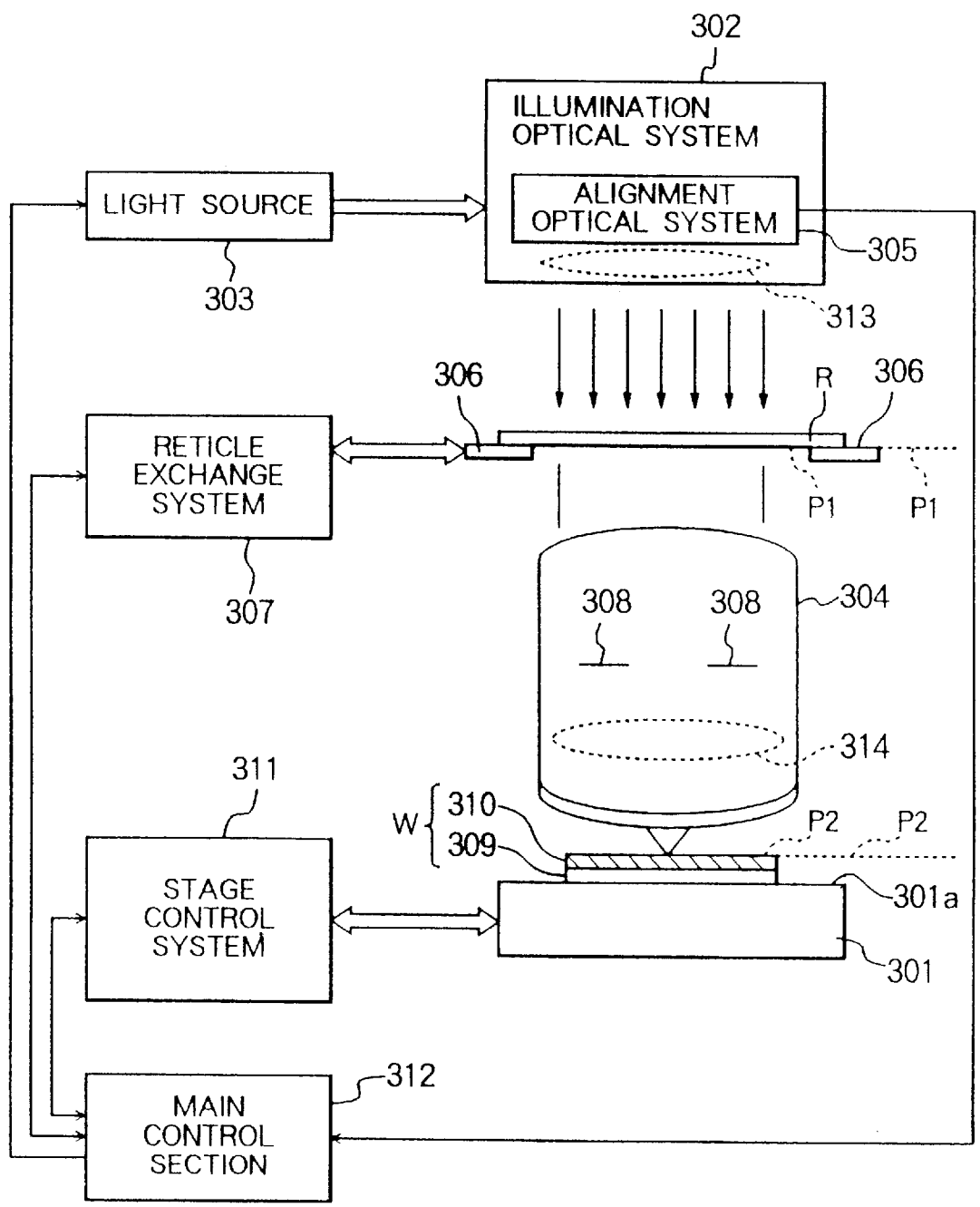
FIG. 2 is a block diagram showing the basic structure of an example of the exposure apparatus of the present invention.

FIG. 2 shows a basic structure of the exposure apparatus according to the present invention. As shown in FIG. 2, an exposure apparatus of the present invention comprises at least a wafer stage 301 allowing a photosensitive substrate W to be held on a main surface 301a thereof, an illumination optical system 302 for emitting vacuum ultraviolet light of a predetermined wavelength as exposure light and transferring a predetermined pattern of a mask (reticle R) onto the substrate W, a light source 303 for supplying the exposure light to the illumination optical system 302, a projection optical system (preferably a catadioptric one) 304 provided between a first surface P1 (object plane) on which the mask R is disposed and a second surface P2 (image plane) to which a surface of the substrate W is corresponded, for projecting an image of the pattern of the mask R onto the substrate W. The illumination optical system 302 includes an alignment optical system 305 for adjusting a relative positions between the mask R and the wafer W, and the mask R is disposed on a reticle stage 306 which is movable in parallel with respect to the main surface of the wafer stage 301. A reticle exchange system 307 conveys and changes a reticle (mask R) to be set on the reticle stage 306. The reticle exchange system 307 includes a stage driver for moving the reticle stage 306 in parallel with respect to the main surface 301a of the wafer stage 301. The projection optical system 304 has a space permitting an aperture stop 308 to be set therein. The sensitive substrate W comprises a wafer 309 such as a silicon wafer or a glass plate, etc., and a photosensitive material 310 such as a photoresist or the like coating a surface of the wafer 309. The wafer stage 301 is moved in parallel with respect to a object plane P1 by a stage control system 311. Further, since a main control section 312 such as a computer system controls the light source 303, the reticle exchange system 307, the stage control system 311 or the like, the exposure apparatus can perform a harmonious action as a whole.

The exposure apparatus of the present invention comprises an optical member which comprises the silica glass of the present invention, for example an optical lens consisting of the above-mentioned silica glass. More specifically, the exposure apparatus of the present invention shown in FIG. 2 can include the optical lens of the present invention as an optical lens 313 in the illumination optical system 302 and/or an optical lens 314 in the projection optical system 304.

Since the exposure apparatus of the present invention is provided with the optical member made of a silica glass which, as mentioned above, exhibits a very small scattering loss amount with respect to light of a short wavelength such as ArF excimer laser beam, as compared with the conventional optical members, the contrast of the image is more sufficiently prevented from lowering due to flare or ghost and it attains a higher resolution.

The techniques relating to an exposure apparatus of the present invention are described, for example, in U.S. patent application Ser. No. 255,927, No. 260,398, No. 299,305, U.S. Pat. No. 4,497,015, No. 4,666,273, No. 5,194,893, No. 5,253,110, No. 5,333,035, No. 5,365,051, No. 5,379,091, or the like. The reference of U.S. patent application Ser. No. 255,927 teaches an illumination optical system (using a laser source) applied to a scan type exposure apparatus. The reference of U.S. patent application Ser. No. 260,398 teaches an illumination optical system (using a lamp source) applied to a scan type exposure apparatus. The reference of U.S. patent application Ser. No. 299,305 teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 teaches a step-and repeat type exposure apparatus capable of using the catadioptric projection optical system of the present invention. The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333,035 teaches an application of an illumination optical system applied to an exposure apparatus. The reference of U.S. Pat. No. 5,365,051 teaches a auto-focusing system applied to an exposure apparatus. The reference of U.S. Pat. No. 5,379,091 teaches an illumination optical system (using a laser source) applied to a scan type exposure apparatus. These documents are hereby incorporated by reference.

Having conducted optical simulation and experiments for evaluating image-forming properties in cases where the above-mentioned optical member is used, the inventors have found it possible to provide an exposure apparatus (photolithography apparatus) which is substantially prevented from being influenced by flare or ghost and there is no problem concerning the decrease of light amount in terms of its property.

Based on this finding, in an optical system constructed by using the optical member of the present invention, a fine and vivid exposure and transfer pattern with a line width of 0.25 μm or less has been obtained.

Thus, the inventors have diligently studied characteristics of the optical member by which a fine and vivid exposure and transfer pattern can be obtained in photolithography techniques. As a result, the inventors have found that, among optical properties of a projection lens, the transmission loss amount is quite influential to the image-forming property in cases where the uniformity in refractive index (Δn), lens surface accuracy, and optical thin-film characteristic are at substantially the level and, more importantly, that the optical properties of the projection lens cannot be correctly expected unless its transmission loss is separated into optical absorption and optical scattering so as to be precisely evaluated. This is because the optical absorption and the optical scattering generate phenomenons different from each other, namely, the former contributes to the deterioration of the image-forming property resulting from the heating within the lens, whereas the latter contributes to the deterioration of the contrast resulting from flare or ghost.

Here, explanation will be provided in detail for the optical scattering in the optical member.

An optical single crystal such as single crystal fluorite ($CaF_2$) is regarded as a perfect crystal. Namely, it is assumed that the whole atoms and ions in the crystal are regularly arranged with a distance of about 5 Å therebetween and that the crystal has a uniform density. Also, in view of Huygens-Fresnel's principle concerning the propagation of light, even when the wave front of light collides with a molecule (i.e., scattering factor) to generate numerous secondary spherical waves, except for the scattering light in the direction where light travels straight ahead, these waves interfere with each other so as to cancel each other. Accordingly, the scattering loss of the optical single crystal becomes quite smaller than that of liquid as well as that of glass or plastic which is in a non-equilibrium state and, when structural defects, fine particles, and the like do not practically exist therewithin, its scattering loss amount is considered to be negligible.

However, since a melt material is rapidly cooled when manufacturing a glass, the arrangement of atoms in the melt glass may be maintained to a certain degree in the cooled glass. Accordingly, while the glass is a solid in terms of a macroscopic property, it has a structure of liquid microscopically. Therefore, like liquid, it is considered that the molecular distribution of the glass does not have a regularity such as that of a crystal and has a statistical thermodynamic fluctuation due to its thermal motion, thereby generating optical scattering. Such optical scattering is known as Rayleigh scattering.

In Rayleigh scattering, the scattering intensity is inversely proportional to the fourth power of wavelength $\lambda$. Accordingly, in optical instruments used in a short wavelength region, Rayleigh scattering of its optical member is influential to the optical properties. In particular, optical instruments such as projection lenses used for photolithography where a superfine resolution is required, flare and ghost caused by transmission loss and scattering light become problematic.

Scattering loss amount of a glass can be calculated by the following equation:

$$s = \frac{8\pi^3}{3\lambda^4} n^8 p^2 kTs\beta T \quad (3)$$

wherein
- s: scattering loss coefficient (/cm)
- p: Pockels coefficient 0.27
- Ts: structure determination temperature (K)
- βT: isothermal compressibility 7E-12 (cm/dyn)
- ρ: density 2.201 (g/cm$^3$)
- λ: wavelength (cm)
- k: Boltzmann constant 1.38E-16 (erg/K)
- n: refractive index For example, when calculation is made with respect to a silica glass, for given physical property values of wavelength λ=193.4 nm, refractive index n=1.5603, and structure determination temperature Ts=1,273 K; the scattering loss coefficient is calculated as s=0.001861/cm, namely, the scattering loss amount is calculated as 0.1861%/cm. In this manner, the inventors have found that a larger amount is expected than the actually measured transmission loss amount and that the main cause for the transmission loss at 193.4 nm is more attributable to scattering loss than optical absorption.

Here, in order to correct the Brillouin scattering portion and to calculate the Rayleigh scattering coefficient, the term of βT is corrected as follows:

$$\beta T \to [\beta T - (\rho v\infty^2)^{-1}] = 5.7 E\text{-}12 \quad (4)$$

wherein
- v∞: high-frequency sound velocity 5.92 (cm/s)

As a result of this calculation, the scattering loss amount becomes 0.1516%/cm.

In view of the foregoing, the theoretically calculated value of the scattering loss is defined as the Rayleigh scattering loss plus the Brillouin scattering loss. Here, the Brillouin scattering loss can be calculated when equation (3) is used while using $(v\infty^2)^{-1}$ shown in equation (4) in place of βT and setting Ts at room temperature (298 K). Brillouin scattering is theoretically estimated as about 1/20 with respect to Rayleigh scattering.

However, thus obtained scattering loss amount may have been estimated lower than its actual value since other scattering factors and inelastic scattering, for example, are not considered. Also, since the values indicated here are calculated from theoretical equations and there may be a problem concerning reliability of physical property values, they should be regarded as nothing other than estimated values.

Therefore, in practice, it is necessary for the scattering loss amount to be measured.

Here, an apparatus for measuring the scattering loss amount will be explained in detail.

Examples of the measurement apparatus include i) integrating sphere type (FIG. 3) which uses an integrating sphere to measure the total scattering amount; ii) goniophotometry type (FIG. 4) used for measuring angular distribution; and iii) ellipsoidal mirror type (FIG. 5) which uses an ellipsoidal mirror.

Among the above-mentioned types, substantially the common light source and optical system are used. With respect to the visible light region, there is used an actual measurement technique in which He-Ne laser (632.8 nm), Ar$^+$ ion laser (e.g., 488 nm) and the like are used as the light source. With respect to the actual wavelength of ArF excimer laser (193.4 nm), there is used an actual measurement technique in which D2 lamp, ArF excimer laser and the like are used as the light source; or another technique in which Hg lamp emission line is used so as to interpolate the scattering loss amount at 193.4 nm according to a calculation equation.

Preferably, a sample has a cylindrical or prismatic form in which light-input and light-output surfaces are parallel planes, while the other surfaces preferably have a surface roughness of 5 Å or less in terms of RMS and a high surface cleanliness. These characteristics are used in order to eliminate the influence of the surface scattering and surface absorption.

The optical scattering and optical absorption in the present invention refer to internal scattering and internal absorption of an optical member, respectively. In the following, the detection means in each type of the measurement apparatus will be explained.

Figure 3:
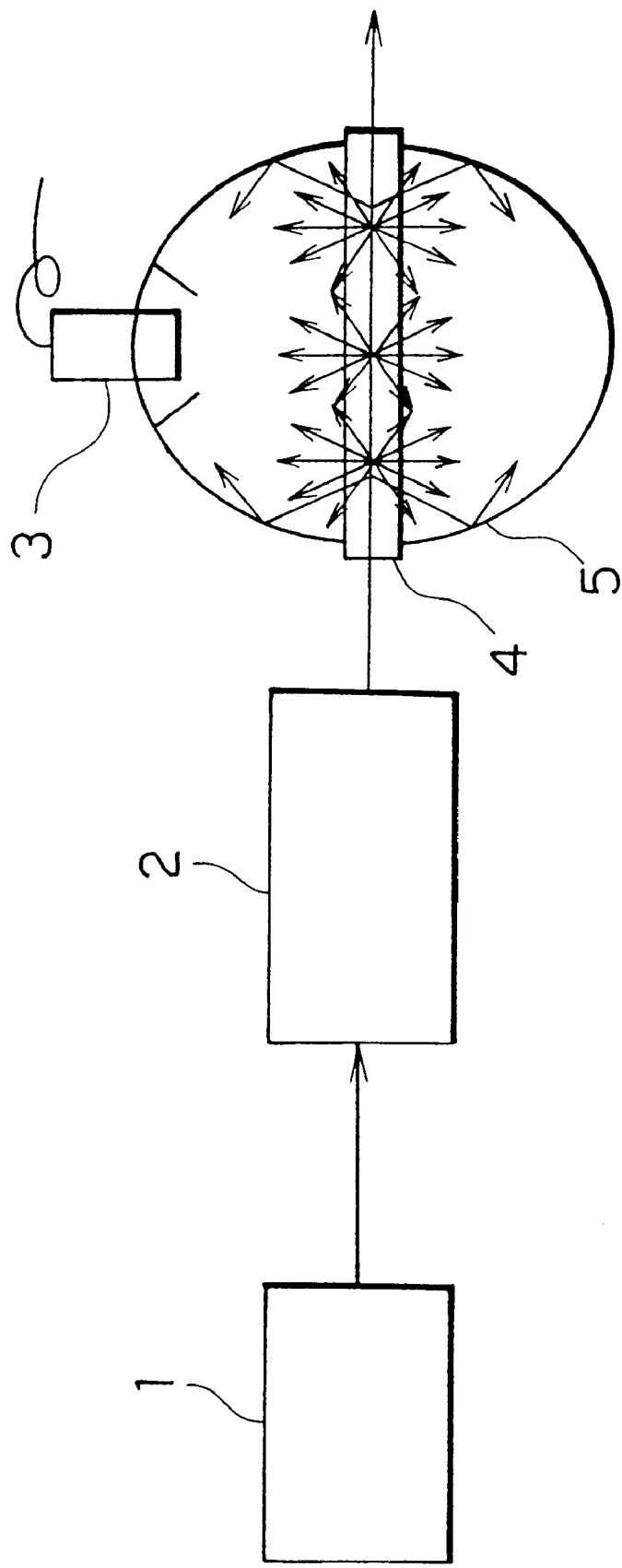
FIG. 3 is a conceptual view showing an integrating sphere type measurement apparatus for scattering light.

In the type shown in FIG. 3 in which an integrating sphere is used, a sample (object to be tested) is held at an optical path portion within the integrating sphere. In this case, it is preferable that the length of the sample is slightly longer than that of the optical path length within the integrating sphere. This feature is used in order to prevent surface-scattered light from entering the integrating sphere.

Also, in order to block a measurement system from surface-reflected and surface-scattered light components, the parallel plane portion is provided with a wedge of a few minutes or the system is tilted by a few degrees with respect to the optical axis. Further, a signal intensity obtained without the sample is used for zero-point calibration while an ND filter or the like whose transmittance is accurately secured is used for determining a calibration curve. As an optical detection device, a photodiode or photomultiplier, for example, which is highly sensitive and stable at each measurement wavelength is used.

Figure 4:
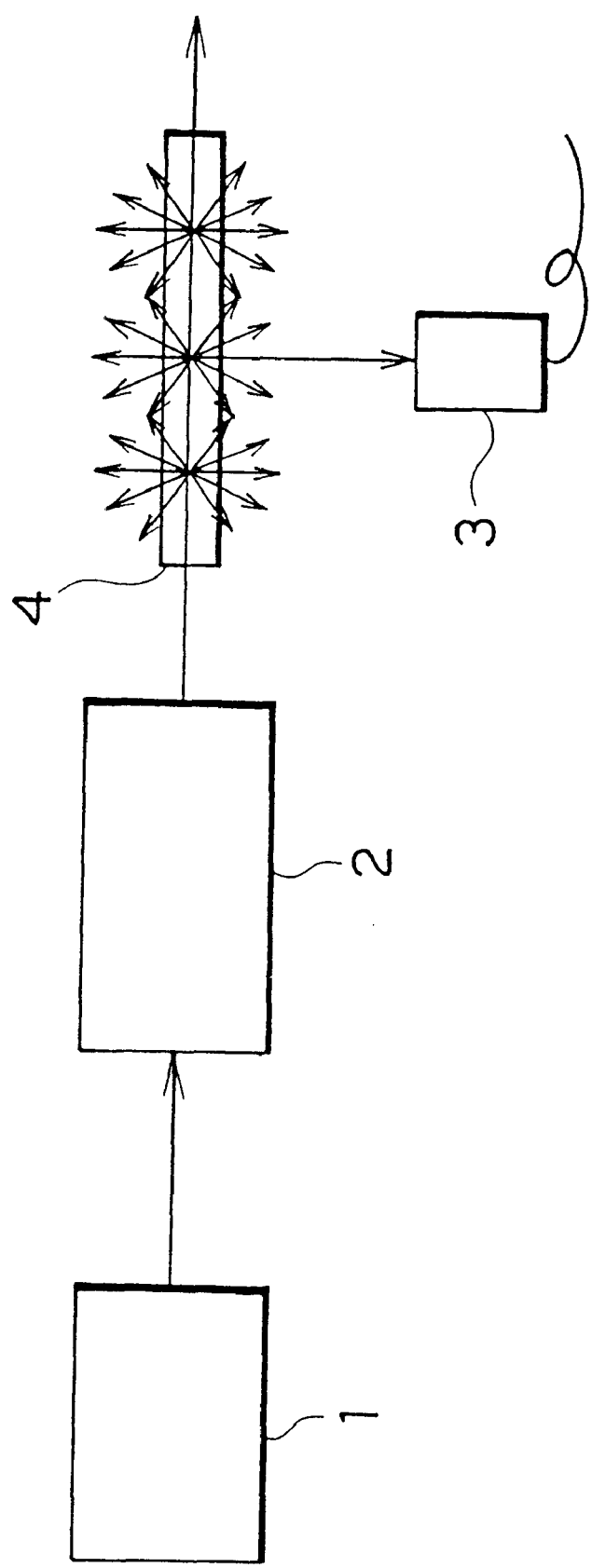
FIG. 4 is a conceptual view showing a goniophotometry type measurement apparatus for scattering light.

FIG. 4 shows an apparatus in which goniophotometry technique is used for measuring, in principle, angular dependency of scattering light. In order to use thus configured apparatus to measure the absolute value of the scattering light, such a value in the visible light region is calculated on the basis of its relative value with respect to a material such as benzene whose scattering loss coefficient is known. In the ultraviolet region, rare gas or the like which is hard to be influenced by optical absorption is preferably used.

For example, based on a relative scattering intensity comparison of θ90 degrees with respect to the optical axis (R90 ratio: intensity of 90-degree direction with respect to optical axis), the whole scattering amount can be estimated by:

$$16\pi/3 \times R90$$

In this case, it is assumed that the angular dependency of the scattering is of complete Rayleigh scattering.

A light-input portion of an optical fiber is set in a θ90-degree direction with respect to the optical axis in order to transfer the scattering light to the detection means, while a spectrometer using a photodiode array is employed as the detection means, thereby enabling easy measurement of the R90 relative value. Also, the spectrum of the scattering light can be confirmed.

Figure 5:
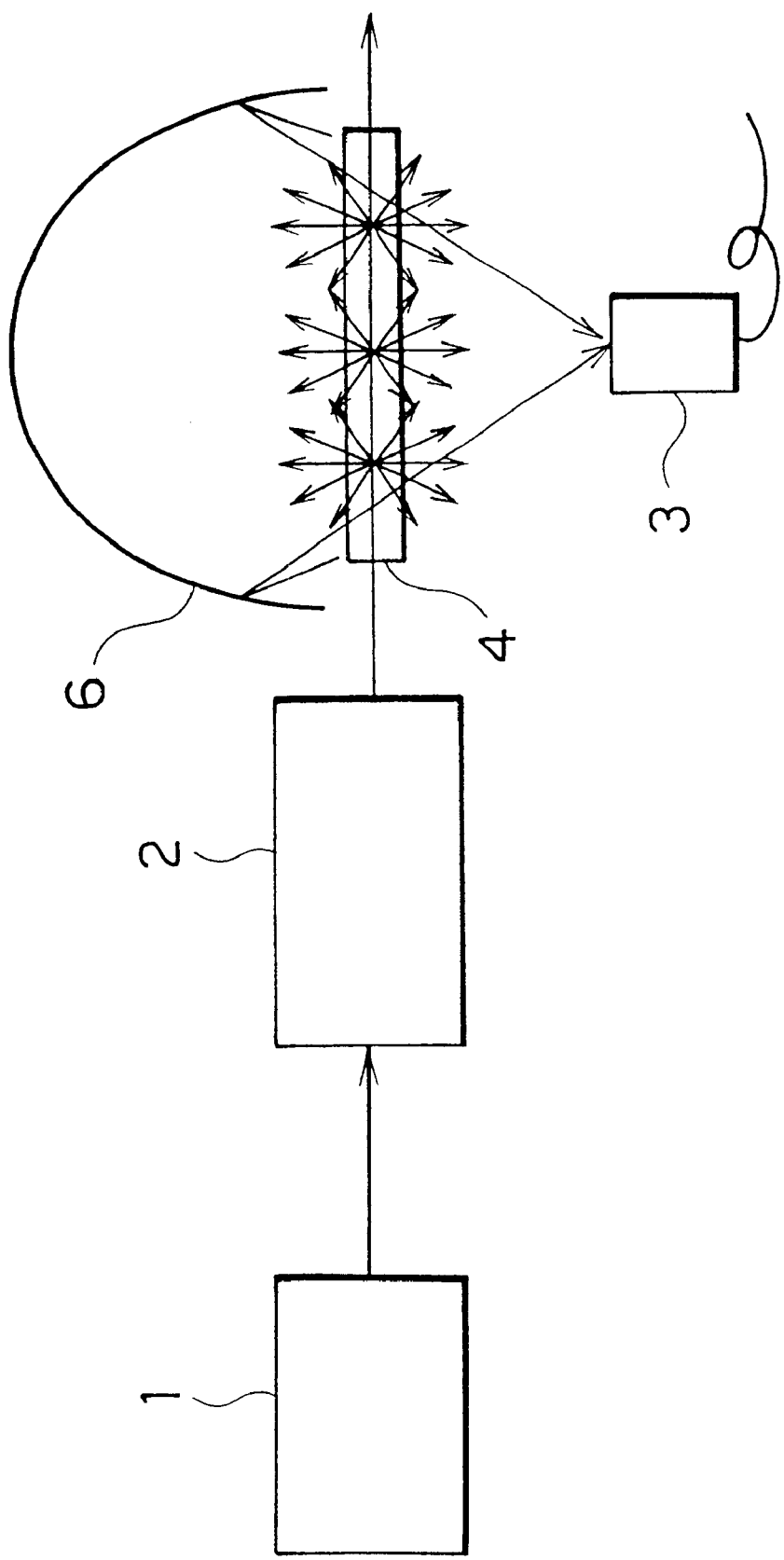
FIG. 5 is a conceptual view showing an ellipsoidal mirror type measurement apparatus for scattering light.

The ellipsoidal mirror type apparatus shown in FIG. 5 is mainly used for measuring the surface scattering. While this apparatus is excellent in measuring relative intensity in the measurement of scattering as well, it is disadvantageous, for example, in that a complicated correction equation is required for calculating the absolute value.

In view of the foregoing, using the actually measured scattering values attained by the integrating sphere type and goniophotometry type apparatuses, the inventors have studied the influences of the scattering loss upon optical properties of a photolithography apparatus such as its resolution and contrast. Also, based on the results thereof, optical simulation and experiments for evaluating image-forming property have been effected.

Figure 6:
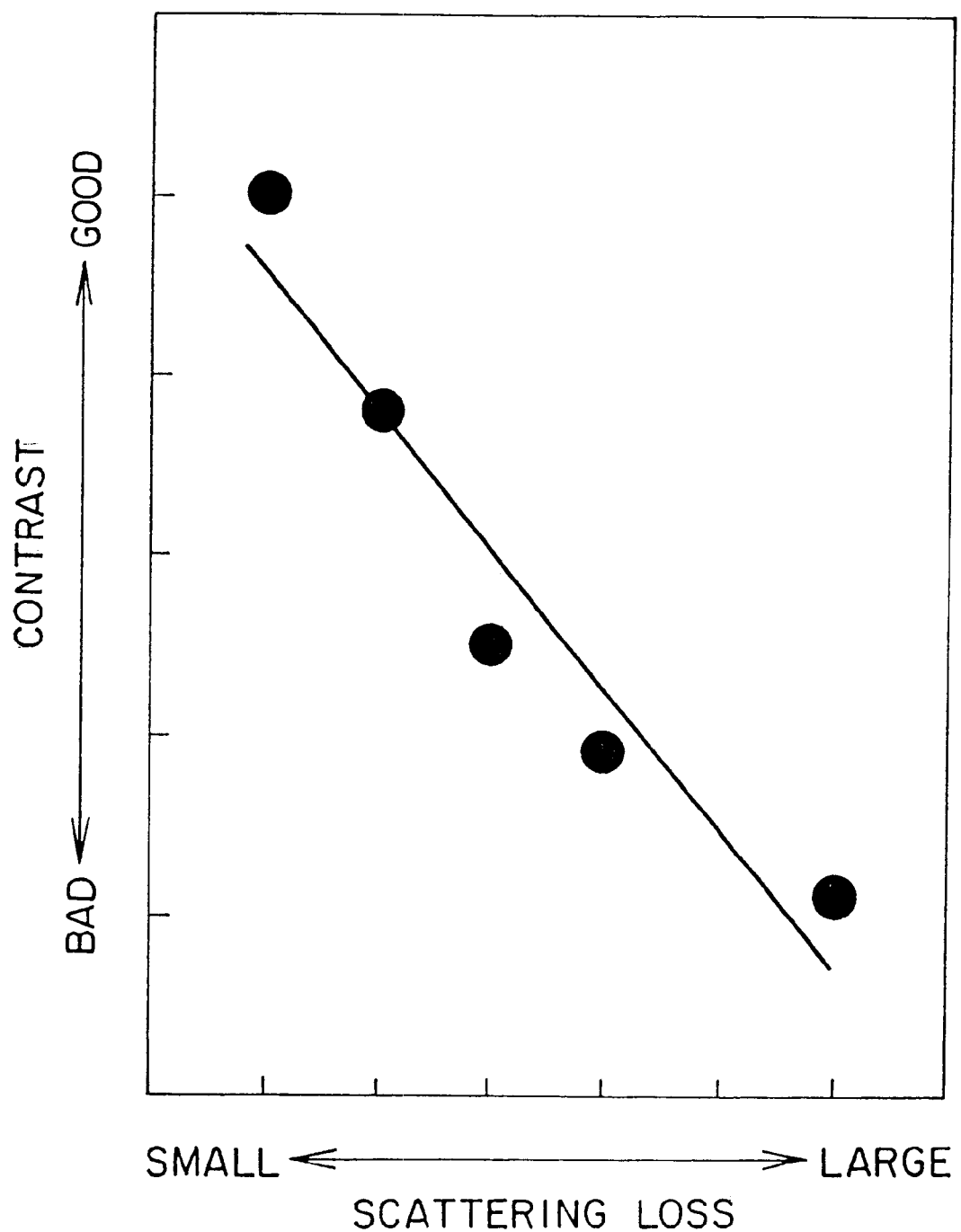
FIG. 6 is a graph showing the relationship between scattering loss amount and contrast.

FIG. 6 shows the relationship between the total scattering loss amount and contrast in an optical system in the photolithography apparatus obtained by the experiments for evaluating image-forming property. As shown in this chart, a very good correlation has been obtained between them.

Here, the standard value of the scattering loss amount, 0.2%/cm, is a value calculated from the following equation:

$$\frac{S0}{L} \simeq 0.2(\%/cm) \tag{5}$$

wherein
- S0: maximum value (%) of total scattering loss allowed for obtaining a required contrast
- L: total optical path length of optical system (cm)
- total scattering loss=(total scattering loss intensity)/(incident light intensity)×100 (%)

Namely, the image-forming evaluation experiments have confirmed that the image-forming property of a stepper is remarkably influenced by not only the absorption loss but scattering loss and that, when the scattering loss amount is 0.2%/cm or less, flare and ghost have substantially no influence and the decrease in light amount is at a level which is not problematic in terms of the property without influencing the image-forming property.

Further, when the scattering loss amount is 0.2%/cm or less with respect to light of 193.4 nm, since the scattering loss amount is inversely proportional to wavelength $\lambda^4$ while being proportional to refractive index $n^8$ the scattering loss amount becomes smaller as the wavelength is longer for light in a wavelength region longer than 193.4 nm, thereby satisfying the standard required for the present invention. This fact has been confirmed by equation (3) as well as by the results of the experiments.

By contrast, from the scattering loss amount in a visible region, for example, at wavelengths of He-Ne laser (632.8 nm) and $Ar^+$ ion laser (e.g., 488 nm), the scattering loss amount at 193.4 nm can be calculated by using the inversely proportional rule with respect to wavelength $\lambda^4$ and the proportional rule with respect to refractive index $n^8$, thereby judging whether the standard in accordance with the present invention, i.e., the scattering loss amount of 0.2%/cm or less, is satisfied or not.

Figure 7:
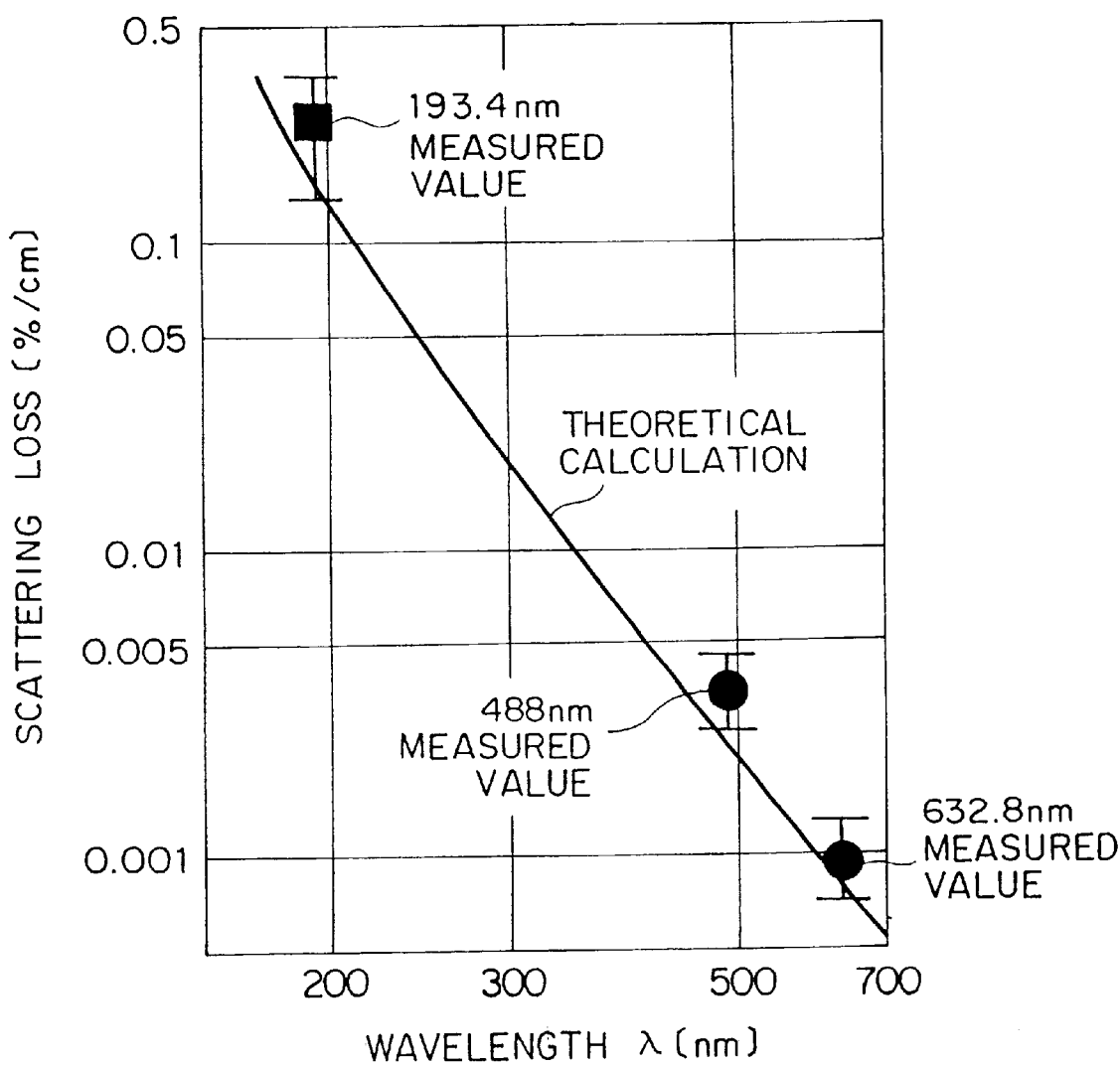
FIG. 7 is a graph showing the relationship between wavelength and scattering loss.

FIG. 7 shows the results obtained when the actually measured values of various kinds of silica glass used for photolithography are compared with theoretically calculated values of scattering loss amount calculated by using equation (3) in which structure determination temperature Ts is set at 1,273 K. As shown in this chart, the actually measured values are higher than the theoretically calculated values and exhibit a large fluctuation. It has been found that, at 193.4 nm, due to such a fluctuation, the conventionally used silica glasses for photolithography exceed the standard for the scattering loss amount in the present invention which is 0.2%/cm or less. By contrast, as can be seen from Examples which will be described later, the silica glass of the present invention can attain a scattering loss amount of 0.2%/cm or less even with respect to light of 193.4 nm.

Figure 8:
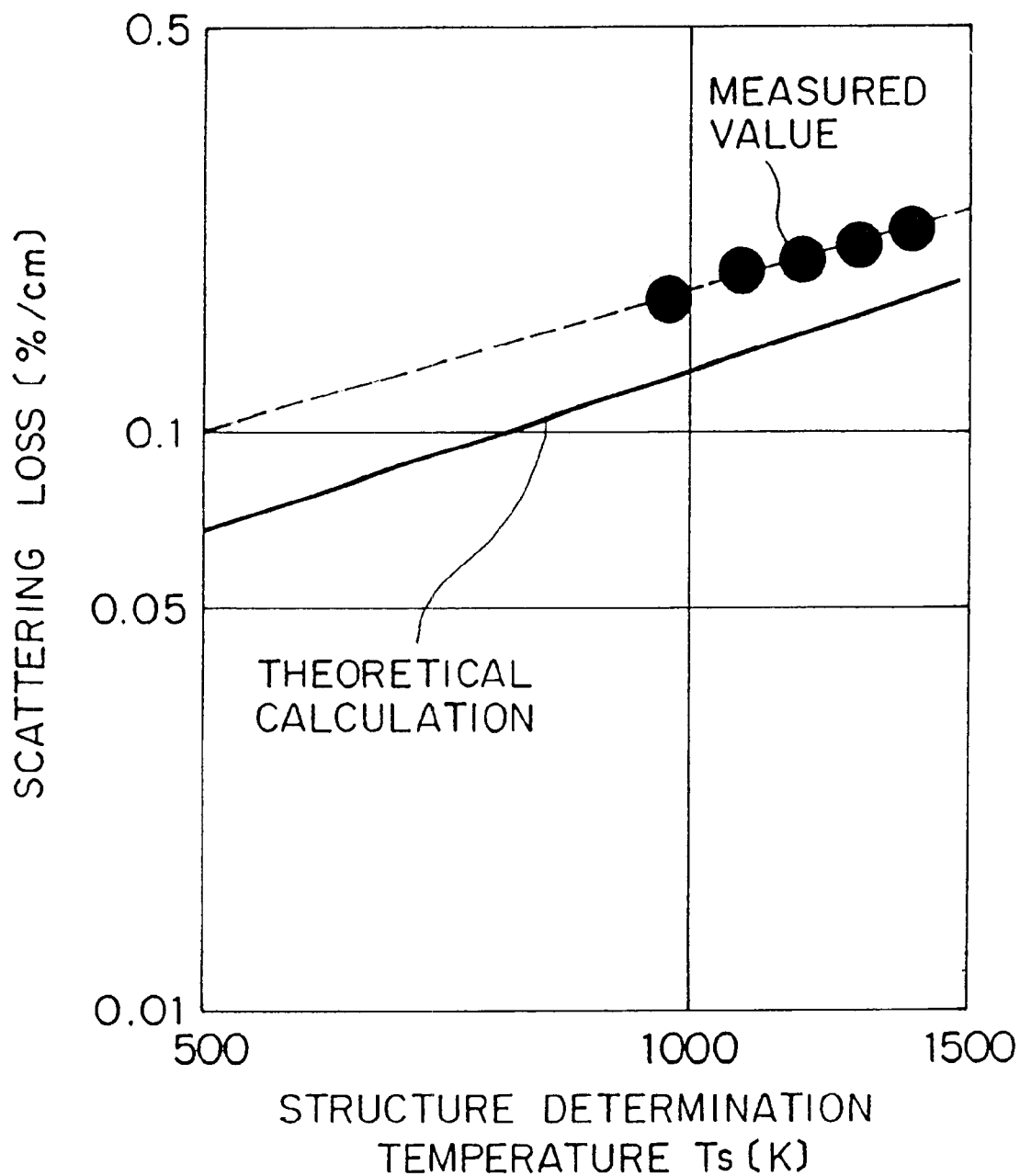
FIG. 8 is a graph showing the relationship between structure determination temperature and scattering loss.

Also, the inventors have confirmed the relationship between structure determination temperature Ts and the scattering loss. FIG. 8 shows the results thereof. Here, the actually measured values are also slightly higher than the theoretical values. This phenomenon is assumed to be the results of optical scattering (e.g., influence of particulate or colloidal scattering factors such as optical glass and influence of inelastic scattering) and lack of reliability in physical properties used for theoretical calculation.

Figure 9:
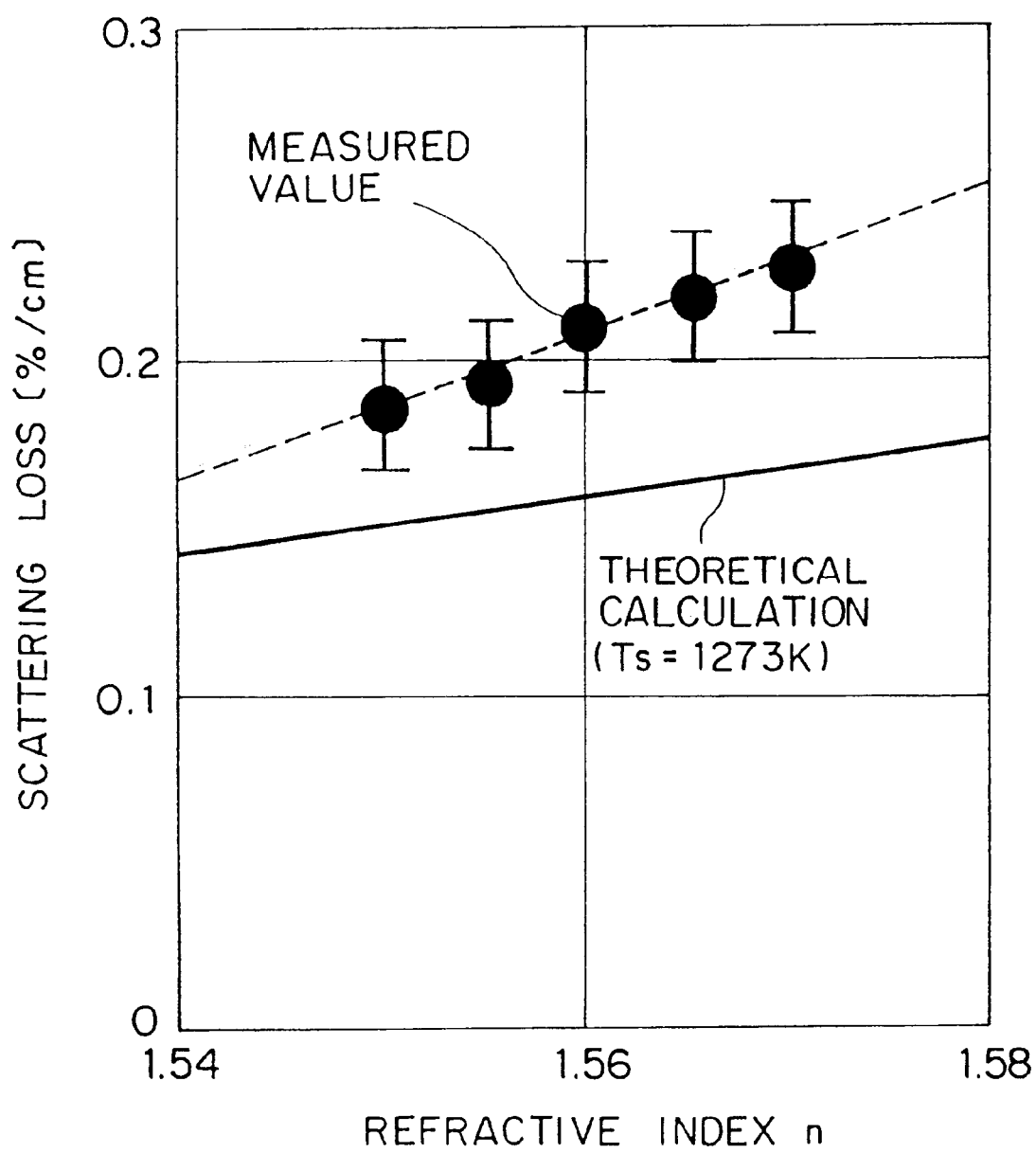
FIG. 9 is a graph showing the relationship between refractive index and scattering loss.

Further, the inventors have confirmed the relationship between the scattering loss and the change in refractive index caused by change in OH group and F concentration in the silica glass and HIP processing. FIG. 9 shows the results thereof. As shown in this chart, the actually measured values are higher than the theoretically calculated values. Also, the scattering loss amount has been found to be dependent on refractive index. Further, it has been discovered that, in order to satisfy the standard for the scattering loss in accordance with the present invention which is 0.2%/cm or less, the refractive index is preferably less than 1.56 with respect to light of 193.4 nm.

Next, the method for producing the silica glass of the present invention will be explained.

In the method for producing the silica glass of the present invention, a silica glass ingot having an OH group concentration of 1,000 ppm or more is heated to a temperature of 1200–1350 K and the ingot is retained at this temperature for a given period of time. When the retention temperature exceeds 1350 K, the surface of the silica glass is degraded, and it would become necessary to spend very long period of time for lowering the structure determination temperature of the silica glass to 1200 K or lower. When the retention temperature is lower than 1200 K, the structure determination temperature cannot be lowered to 1200 K or lower in a given period, and, furthermore, annealing is insufficient and strain cannot be removed. The retention time is preferably a period of longer than the structure relaxation time at the retention temperature, especially preferably 1–24 hours. For example, in the case of the silica glass having a structure determination temperature of 1300 K or higher and containing OH group in an amount of about 1000 ppm, the structure relaxation time at 1273 K is 280 seconds. The heating rate (temperature-rising rate) does not affect the properties of the resulting silica glass, but is preferably less than about 150 K/hr.

Then, the above silica glass ingot is cooled to a temperature (annealing completion temperature (a.c.t.) 25) of 1000 K or lower, preferably 873 K or lower, more preferably 473 K or lower, at a cooling rate (annealing rate or temperature-lowering rate for annealing) of 50 k/hr or less, preferably 20 K/hr or less, thereby to anneal the ingot. When the annealing completion temperature is higher than 1000 K or the annealing rate (temperature-lowering rate) is higher than 50 k/hr, the structure determination temperature cannot be lowered to 1200 K or lower and, besides, strain cannot be sufficiently removed.

After the ingot reaches the above annealing completion temperature, usually it is air-cooled or spontaneously cooled to room temperature, though this is not essential. The atmosphere of the above annealing step is unlimited and may be air. The pressure is also unlimited and may be atmospheric pressure.

Further, the method of the present invention preferably additionally includes, prior to the annealing step, a step of hydrolyzing a silicon compound such as $SiCl_4$, $SiHCl_3$, $SiF_4$, or the like in a flame (preferably oxy-hydrogen flame) to obtain fine glass particles (glass soot) and depositing and fusing the fine glass particles to obtain the silica glass ingot having an OH group concentration of 1,000 ppm or more.

Moreover, preferably, the method of the present invention further comprises a step of descending the temperature of the above-mentioned silica glass ingot from a temperature of at least 1,373 K to a temperature of 1073 K or lower, preferably to a temperature of 773 K or lower, more preferably to room temperature, at a rate of 50 K/hr or less, preferably 20 K/hr or less, and more preferably 10 K/hr, thereby to pre-anneal the silica glass ingot. When the silica glass ingot is pre-annealed in this manner, the structure determination temperature of the silica glass tends to become lower.

As mentioned above, the silica glass ingot of the present invention is preferably prepared by the above-mentioned direct method, namely, oxy-hydrogen flame hydrolysis. That is, ≡Si—Si≡ bond, ≡Si—O—O—Si≡ bond and the like are known as the precursors which cause formation of structural defects when synthetic silica glass is irradiated with ultraviolet light, and synthetic glasses obtained by so-called soot methods (VAD method, OVD method) or plasma method have these precursors. On the other hand, synthetic silica glasses produced by the direct method have no incomplete structures of oxygen-shortage or -excessive type formed by deviation from the stoichiometric ratio. Furthermore, high purity of low metallic impurities can generally be attained in the synthetic silica glasses produced by the direct method. Moreover, since the silica glasses synthesized by the direct method generally contain more than several hundred ppm of OH group, they are structurally more stable as compared with silica glasses containing no OH group.

The silica glass synthesized by the so-called direct method which comprises hydrolyzing silicon chloride with oxy-hydrogen flame and depositing the resulting silica fine glass particles on a target and melting it to form a silica glass ingot has a structure determination temperature of 1300 K or higher at the state just after synthesis.

In order to obtain a silica glass ingot having an OH group concentration of 1,000 ppm or more by the direct method, it is preferred that the volume ratio of oxygen gas to hydrogen gas ($O_2/H_2$) in the flame is at least 0.4, more preferably 0.42–0.5. When this ratio (oxygen hydrogen gas ratio) is less than 0.4, it tends to occur that the resulting silica glass ingot does not contain 1,000 ppm or more of OH group.

Furthermore, in the method of the present invention, the effect of the above-mentioned annealing is attained more effectively and uniformly by cutting the silica glass ingot to make blanks having a given size, preferably 200–400 mm in diameter and 40–150 mm in thickness, and then, annealing them.

EXAMPLES 1–14 AND COMPARATIVE EXAMPLES 1–10

Figure 10:
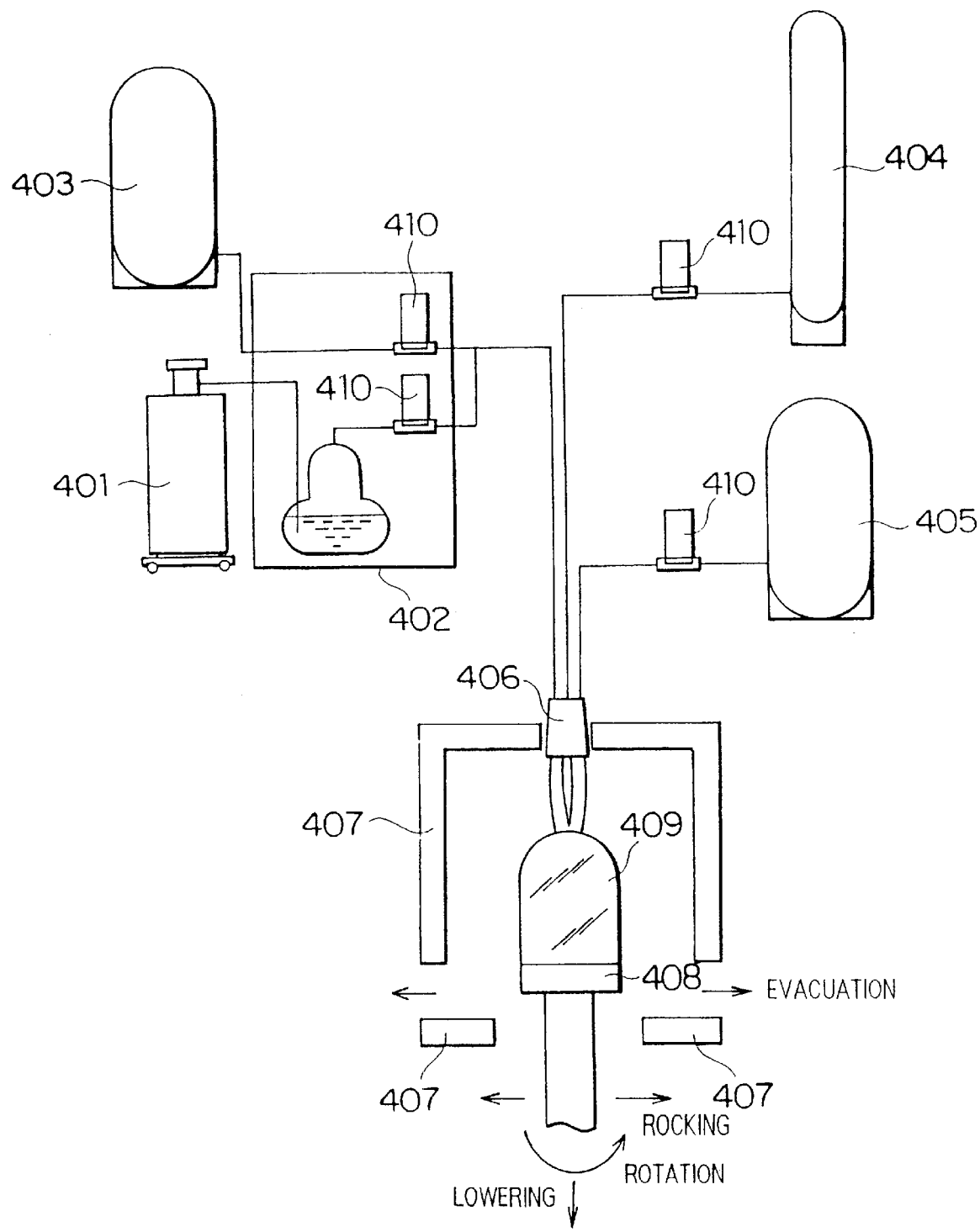
FIG. 10 is a schematic view showing an example of an apparatus for producing a silica glass ingot in accordance with the present invention.

A silica glass ingot was produced using the apparatus for producing silica glass as shown in FIG. 10. That is, high purity silicon tetrachloride A (starting material) (Examples 1–11 and Comparative Examples 1–8), or silicon tetrachloride A and silicon tetrafluoride B (starting material) (Examples 12–14 and Comparative Examples 9–10), which are fed from silicon compound bomb 401, was mixed with a carrier gas fed from oxygen gas bomb 403 in baking system 402, and the mixture was fed to silica glass burner 406 together with hydrogen gas fed from hydrogen bomb 404 and oxygen gas fed from oxygen gas bomb 405. Oxygen gas and hydrogen gas in flow rates shown in Table 1 were mixed and burnt in the burner 406 and the starting material gas in the flow rate shown in Table 1 was diluted with a carrier gas (oxygen gas) and ejected from the central part to obtain silica fine glass particles ($SiO_2$ fine particles). The silica fine glass particles were deposited and molten on target 408 surrounded by refractory 407 and then cooled to room temperature at a temperature-lowering rate (cooling rate at pre-annealing) shown in Table 2 thereby to obtain silica glass ingot 409 (500 mm long) having the composition shown in Table 1. In this case, the upper face (synthesis face) was covered with flame and the target 408 was lowered at a constant speed with rotating and rocking at a constant period. The structure determination temperature of the silica glass at this stage was 1400 K. The reference numeral 410 in FIG. 10 indicates a mass flow controller and R in Table 1 indicates an oxygen hydrogen ratio ($O_2/H_2$).

Figure 11:
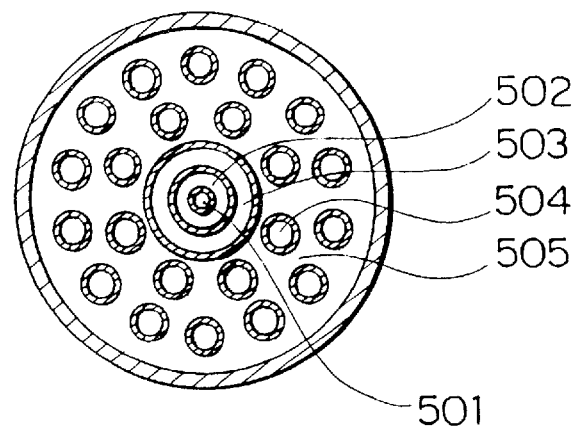
FIG. 11 is a bottom view showing an example of a burner for producing a silica glass ingot in accordance with the present invention.

The burner 406 has quintuple tube structure as shown in FIG. 11, and 501 indicates an ejection port for starting material and carrier gas, 502 indicates an ejection port for inner side oxygen gas (OI), 503 indicates an ejection port for inner side hydrogen gas (HI), 504 indicates an ejection port for outer side oxygen gas (OO), and 505 indicates an ejection port for outside hydrogen gas (HO). The size (mm) of the ejection port is as follows.

|  | Inner diameter | Outer diameter |
| --- | --- | --- |
| Burner A | | |
| 501 | 6.0 | 9.0 |
| 502 | 12.0 | 15.0 |
| 503 | 17.0 | 20.0 |
| 504 | 3.5 | 6.0 |
| 505 | 59.0 | 63.0 |
| Burner B | | |
| 501 | 3.5 | 6.5 |
| 502 | 9.5 | 12.5 |
| 503 | 14.5 | 17.5 |
| 504 | 3.5 | 6.0 |
| 505 | 59.0 | 63.0 |
| Burner C | | |
| 501 | 2.0 | 5.0 |
| 502 | 8.5 | 11.5 |
| 503 | 14.5 | 17.5 |
| 504 | 3.5 | 6.0 |
| 505 | 59.0 | 63.0 |

Figure 12:
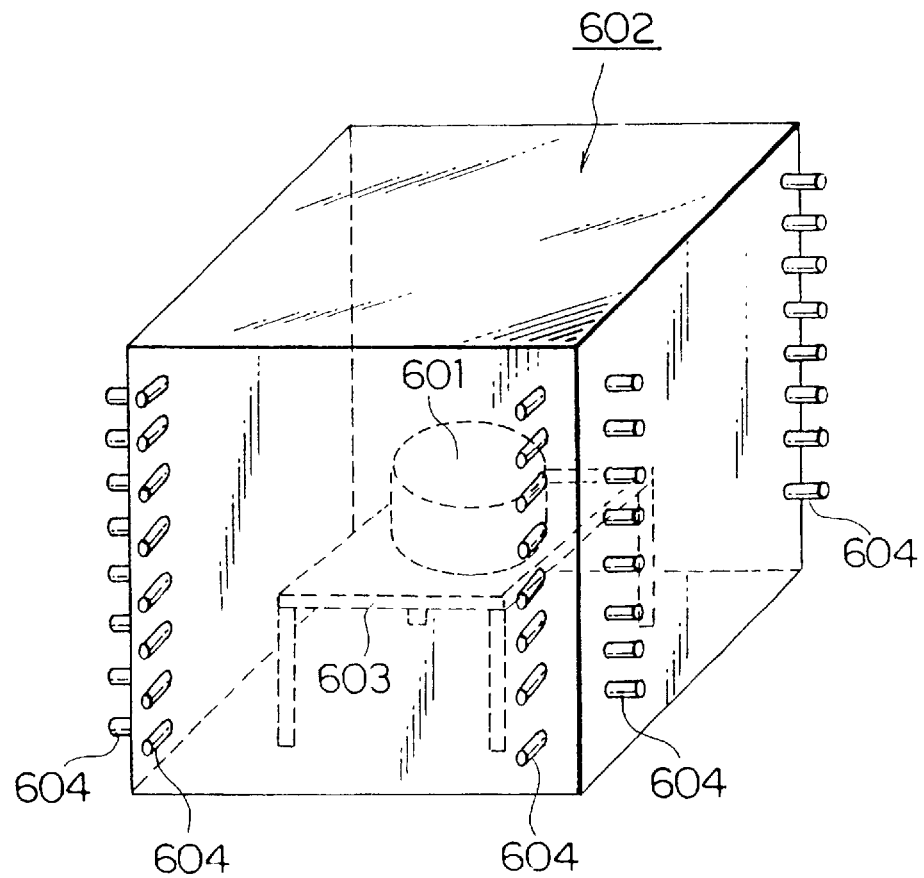
FIG. 12 is a perspective view showing an example of an annealing furnace in accordance with the present invention.

Then, a test piece to be irradiated with ArF excimer laser beam (60 mm in diameter and 10 mm in thickness, the opposite two sides being subjected to optical abrasion) was prepared from each of the resulting ingots. The test piece was placed in an annealing furnace made of an insulating firebrick as shown in FIG. 12 and heated to retention temperature from room temperature at a heating rate shown in Table 2. After lapse of the retention time, it was cooled to the annealing completion temperature from the retention temperature at an annealing rate (temperature-lowering rate) shown in Table 2 and, thereafter, spontaneously cooled to room temperature. The cooling rate after a.c.t. shown in Table 2 is a cooling rate one hour after starting of the spontaneous cooling. Moreover, in FIG. 12, 601 indicates a test piece, 602 indicates an annealing furnace, 603 indicates a stand comprising a silica glass and legs made of a firebrick, and 604 indicates a rod-like SiC heating element.

TABLE 1

| Example/ Comparative Example | H$_2$ Concentration [mol./cm$^3$] | F Concentration [ppm] | Starting Material Gas Kind | Starting Material Gas Flow Rate [g/min] | Starting Material Gas Flow Velocity [g/min/cm$^2$] | Inner Side Oxygen · Hydrogen Gas HI [slm] | Inner Side Oxygen · Hydrogen Gas OI [slm] | Inner Side Oxygen · Hydrogen Gas R | Outer Side Oxygen · Hydrogen Gas HO [slm] | Outer Side Oxygen · Hydrogen Gas OO [slm] | Outer Side Oxygen · Hydrogen Gas R | Growing Rate of Ingot [mm/hr] | Diameter of Ingot [mm] | Inner Diameter of Tube for Starting Material [mmφ] |
|---|---|---|---|---|---|---|---|---|---|---|---|---|---|---|
| Ex. 1-6 Comp. Ex. 1-3 | About 1.1 × 10$^{17}$ | 0 | A | 30 | 330 | 70 | 30.8 | 0.44 | 200 | 78 | 0.44 | 0.6 | 200 | 6.0 |
| Ex. 7 | <1 × 10$^{16}$ | 0 | A | 30 | 330 | 70 | 35 | 0.5 | 200 | 100 | 0.5 | 0.6 | 200 | 6.0 |
| Ex. 8 | About 1.3 × 10$^{17}$ | 0 | A | 30 | 330 | 70 | 28 | 0.40 | 200 | 78 | 0.44 | 0.6 | 200 | 6.0 |
| Ex. 9-11 Comp. Ex. 4 | About 1.5 × 10$^{17}$ | 0 | A | 30 | 330 | 70 | 29.4 | 0.42 | 200 | 78 | 0.44 | 0.6 | 200 | 6.0 |
| Comp. Ex. 5-6 | About 2.1 × 10$^{18}$ | 0 | A | 30 | 330 | 150 | 45 | 0.3 | 360 | 158 | 0.44 | 4.0 | 250 | 3.5 |
| Comp. Ex. 7-8 | About 2.1 × 10$^{18}$ | 0 | A | 30 | 330 | 150 | 45 | 0.3 | 360 | 158 | 0.44 | 8.0 | 250 | 2.0 |
| Ex. 12-13 Comp. Ex. 9 | <1 × 10$^{16}$ | 350 | A B | 20 6.1 | 330 | 70 | 35 | 0.5 | 200 | 100 | 0.5 | 0.6 | 200 | 6.0 |
| Comp. Ex. 10 | About 2.1 × 10$^{18}$ | 350 | A B | 20 6.1 | 330 | 150 | 45 | 0.3 | 360 | 158 | 0.44 | 4.0 | 250 | 3.5 |
| Ex. 14 | About 2.1 × 10$^{18}$ | 800 | A B | 10 12.2 | 330 | 150 | 45 | 0.3 | 200 | 78 | 0.44 | 0.6 | 200 | 6.0 |

TABLE 2

| Example/ Comparative Example | Pre-Annealing Cooling Rate [K/hr] | Annealing Heating Rate [K/hr] | Annealing Retention Temp. [K] | Annealing Retention Time [hr] | Annealing Annealing Rate [K/hr] | Annealing Completion Temperature (a.c.t) [K] | Cooling Rate After a.c.t. [K/hr] |
|---|---|---|---|---|---|---|---|
| Ex. 1 | 125 | 100 | 1223 | 10 | 1.0 | 773 | 80 |
| Ex. 2 | 125 | 100 | 1273 | 10 | 1.0 | 773 | 80 |
| Ex. 3 | 125 | 100 | 1273 | 5 | 1.0 | 773 | 80 |
| Ex. 4 | 125 | 100 | 1273 | 10 | 5 | 773 | 80 |
| Ex. 5 | 125 | 100 | 1273 | 10 | 10 | 773 | 80 |
| Ex. 6 | 125 | 100 | 1273 | 10 | 10 | 993 | 80 |
| Comp. Ex. 1 | 125 | 100 | 1273 | 10 | 10 | 1173 | 80 |
| Comp. Ex. 2 | 125 | 100 | 1273 | 10 | 100 | 773 | 80 |
| Comp. Ex. 3 | 125 | 100 | 1373 | 10 | 10 | 773 | 80 |
| Ex. 7 | 50 | 100 | 1273 | 10 | 7 | 773 | 80 |
| Ex. 8 | 50 | 100 | 1273 | 10 | 10 | 773 | 80 |
| Ex. 9 | 50 | 100 | 1273 | 10 | 20 | 773 | 80 |
| Comp. Ex. 4 | 50 | 100 | 1273 | 10 | 100 | 773 | 80 |
| Ex. 10 | 125 | 100 | 1223 | 10 | 1.0 | 773 | 80 |
| Comp. Ex. 5 | 125 | 100 | 1223 | 10 | 1.0 | 773 | 80 |
| Ex. 11 | 125 | 100 | 1273 | 10 | 10 | 773 | 80 |
| Comp. Ex. 6 | 125 | 100 | 1273 | 10 | 10 | 773 | 80 |
| Comp. Ex. 7 | 125 | 100 | 1273 | 10 | 100 | 773 | 80 |
| Comp. Ex. 8 | 50 | 100 | 1373 | 10 | 10 | 773 | 80 |
| Ex. 12 | 50 | 100 | 1223 | 10 | 1.0 | 773 | 80 |
| Ex. 13 | 125 | 100 | 1223 | 10 | 10 | 773 | 80 |
| Comp. Ex. 9 | 125 | 100 | 1373 | 10 | 100 | 773 | 80 |
| Comp. Ex. 10 | 125 | 100 | 1273 | 10 | 10 | 773 | 80 |
| Ex. 14 | 125 | 100 | 1223 | 10 | 10 | 773 | 80 |

TABLE 3

| Example/ Comparative Example | Ts [K] | OH Group Concentration [ppm] | F Concentration [ppm] | H$_2$ Concentration [mol./cm$^3$] | Scattering Loss [%/cm] |
|---|---|---|---|---|---|
| Ex. 1 | 1023 | 1200 | 0 | 1 × 10$^{17}$ | 0.10 |
| Ex. 2 | 1073 | 1200 | 0 | 1 × 10$^{17}$ | 0.12 |
| Ex. 3 | 1123 | 1200 | 0 | 1 × 10$^{17}$ | 0.15 |
| Ex. 4 | 1150 | 1200 | 0 | 1 × 10$^{17}$ | 0.17 |
| Ex. 5 | 1173 | 1200 | 0 | 1 × 10$^{17}$ | 0.18 |
| Ex. 6 | 1198 | 1200 | 0 | 1 × 10$^{17}$ | 0.19 |
| Comp. Ex. 1 | 1223 | 1200 | 0 | 1 × 10$^{17}$ | 0.23 |
| Comp. Ex. 2 | 1273 | 1200 | 0 | 1 × 10$^{17}$ | 0.23 |
| Comp. Ex. 3 | 1223 | 1200 | 0 | <1 × 10$^{16}$ | 0.24 |
| Ex. 7 | 1223 | 1250 | 0 | <1 × 10$^{16}$ | 0.1 |
| Ex. 8 | 1150 | 1010 | 0 | 1.2 × 10$^{17}$ | 0.15 |
| Ex. 9 | 1193 | 1050 | 0 | 1.4 × 10$^{17}$ | 0.18 |

TABLE 3-continued

| Example/ Comparative Example | Ts [K] | OH Group Concentration [ppm] | F Concentration [ppm] | $H_2$ Concentration [mol./cm$^3$] | Scattering Loss [%/cm] |
|---|---|---|---|---|---|
| Comp. Ex. 4 | 1223 | 1050 | 0 | $1.4 \times 10^{17}$ | 0.23 |
| Ex. 10 | 1023 | 1050 | 0 | $1.4 \times 10^{17}$ | 0.11 |
| Comp. Ex. 5 | 1023 | 900 | 0 | $2 \times 10^{18}$ | 0.23 |
| Ex. 11 | 1173 | 1050 | 0 | $1.4 \times 10^{17}$ | 0.16 |
| Comp. Ex. 6 | 1173 | 900 | 0 | $2 \times 10^{18}$ | 0.22 |
| Comp. Ex. 7 | 1273 | 780 | 0 | $2 \times 10^{18}$ | 0.35 |
| Comp. Ex. 8 | 1223 | 780 | 0 | $1 \times 10^{17}$ | 0.3 |
| Ex. 12 | 1023 | 1200 | 350 | $<1 \times 10^{16}$ | 0.07 |
| Ex. 13 | 1173 | 1200 | 350 | $<1 \times 10^{16}$ | 0.2 |
| Comp. Ex. 9 | 1223 | 1200 | 350 | $<1 \times 10^{16}$ | 0.4 |
| Comp. Ex. 10 | 1173 | 900 | 350 | $2 \times 10^{18}$ | 0.21 |
| Ex. 14 | 1123 | 1200 | 800 | $2 \times 10^{18}$ | 0.10 |

Structure determination temperature (Ts), OH group concentration, F concentration and hydrogen molecule concentration of these test pieces were measured. The results are shown in Table 3. The structure determination temperature was obtained by inversely calculating from measured 606 cm$^{-1}$ line intensity value based on the previously prepared calibration curve. The hydrogen molecule concentration was measured by a laser Raman photometer. That is, among the Raman scattered lights perpendicular to the sample which occurred when the sample was irradiated with Ar+ laser beam (output 800 mW), intensity of 800 cm$^{-1}$ and 4135 cm$^{-1}$ was measured and the ratio of the intensities was determined. The OH group concentration was measured by infrared absorption spectrometry (measurement of absorption by OH group for 1.38 μm). In addition, quantitative analysis of metallic impurities (Mg, Ca, Ti, Cr, Fe, Ni, Cu, Zn, Co, Mn, Na and K) in the test pieces was conducted by inductively coupled plasma spectrometry to find that the concentrations of them were lower than 20 ppb, respectively.

Scattering loss amount of each of the test pieces thus obtained with respect to ArF excimer laser beam was measured. The results are shown in Table 3. As is clear from Table 3, the silica glasses of the present invention (Examples 1–14) satisfied the desired conditions on the scattering loss amount.

Figure 13:
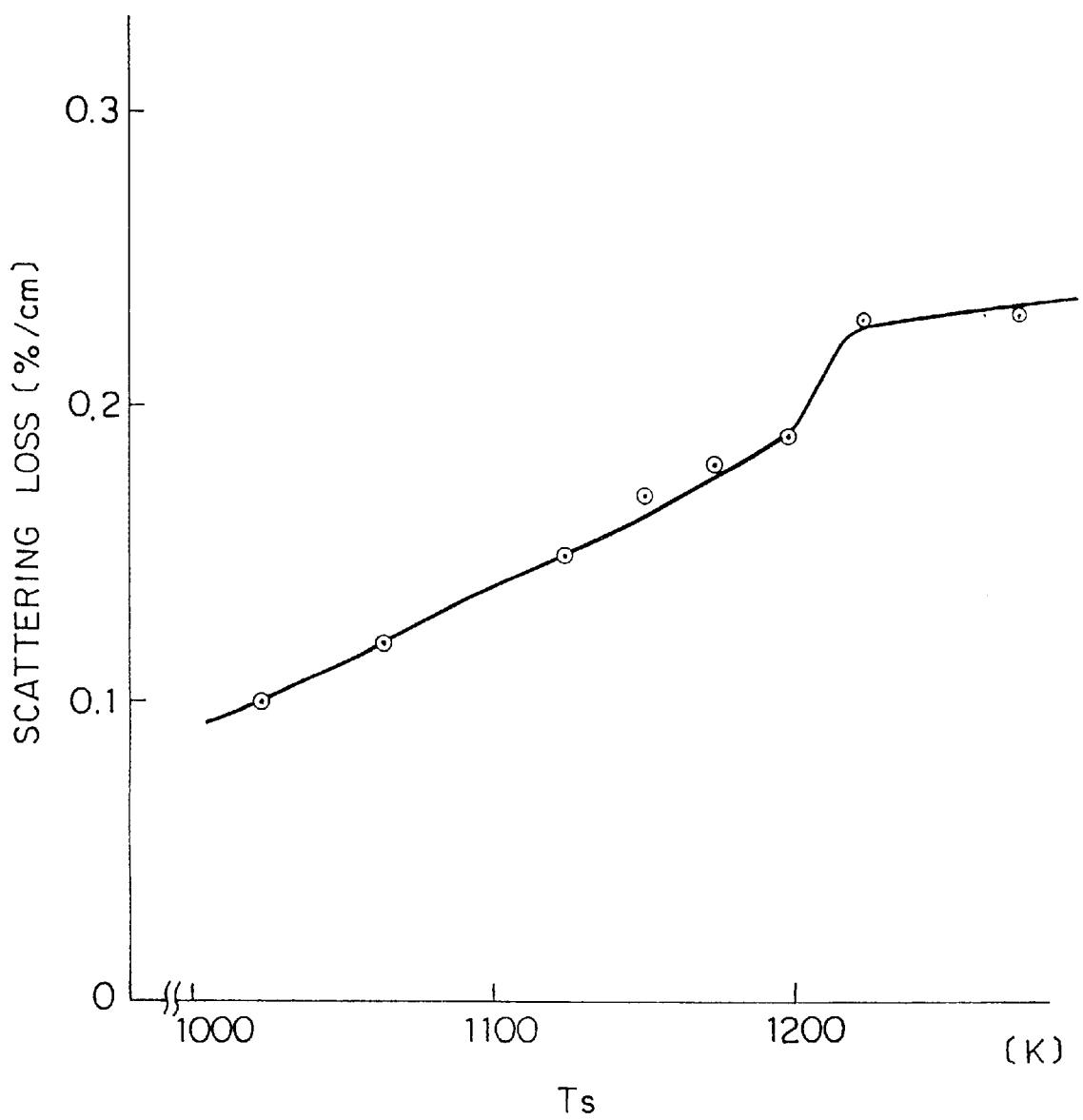
FIG. 13 is a graph showing the relationship between structure determination temperature and scattering loss.

Furthermore, as is clear from FIG. 13, when the OH group concentration was 1000 ppm or more, the scattering loss amount extremely decreased by reducing the structure determination temperature to 1200 K or lower.

Also, the scattering loss characteristic, polarization characteristic, and birefringence characteristic of each silica glass obtained by the Examples exhibited a center symmetry. Their birefringence amount was 2 nm/cm or less.

Further, the results of the measurement of various characteristics of the silica glass obtained by the Examples are as indicated in the following. Namely, the internal absorptivity of the above-mentioned silica glass with a thickness of 10 mm was 0.2%/cm or less with respect to ArF excimer laser. The internal transmittance of the above-mentioned silica glass with a thickness of 10 mm was 99.8% or more with respect to ArF excimer laser. Also, after being irradiated with 1×10$^6$ pulses of KrF excimer laser at an average one-pulse energy density of 400 mJ/cm$^2$, the internal transmittance of the above-mentioned silica glass having a thickness of 10 mm was 99.5% or more with respect to light having a wavelength of 248 nm. Further, after being irradiated with 1×10$^6$ pulses of ArF excimer laser at an average one-pulse energy density of 100 mJ/cm$^2$, the internal transmittance of the above-mentioned silica glass having a thickness of 10 mm was 99.5% or more with respect to light having a wavelength of 193 nm.

COMPARATIVE EXAMPLE 11

A test piece of silica glass was prepared in the same manner as Example 4 except that the holding temperature was set at 1,123 K. Since the structure was not relaxed during the holding time, the structure determination temperature did not become 1,200 K or lower. Also, due to insufficient annealing, strain was not removed.

COMPARATIVE EXAMPLE 12

A silica glass simply satisfying a specification of a lens material characteristic of $\Delta n \leq 2 \times 10^{-6}$, a birefringence amount $\leq 2$ nm/cm, and an internal transmittance of 99.6% or more was used to prepare a projection lens for an ArF excimer laser stepper. The resolution (L/S) of thus prepared lens was 0.30 μm with respect to the designed L/S of 0.20 μm. Also, its contrast was so unfavorable that the designed property could not be obtained. Thus, it was found that the selection of the optical member according to such a specification alone was insufficient. It is assumed that, since the absorption loss amount or scattering loss amount exceeded 0.2%/cm, the internal heating within the lens caused by optical absorption and the flare generated by optical scattering became remarkably influential to the deterioration of L/S.

Here, L/S is an abbreviation of "line and space" which is a value generally used as an index for evaluating properties of semiconductor manufacturing.

Homogeneity was measured by oil-on-plate technique in which a He-Ne laser interferometer was used, whereas birefringence was measured by rotational analyzer technique. Internal transmittance was measured by a normal spectrophotometer.

EXAMPLE 15

A silica glass of the present invention satisfying a specification of a lens material characteristic of $\Delta n \leq 2 \times 10^{-6}$ and a birefringence amount $\leq 2$ nm/cm as well as both scattering loss amount and absorption loss amount of 0.2%/cm or less was used to prepare a projection lens for ArF excimer laser stepper. The resolution (L/S) of thus prepared lens was 0.20 μm with respect to the designed L/S of 0.20 μm. Also, its contrast was favorable. Thus, by selecting the optical member according to this specification, properties approximating the designed values were obtained.

Homogeneity was measured by oil-on-plate technique in which a He—Ne laser interferometer was used, whereas birefringence was measured by phase modulation technique. The silica glass used here exhibited a 10-mm internal transmittance exceeding 99.6% at 193 nm.

Also, after being irradiated with 1×10$^6$ pulses of ArF excimer laser at an average one-pulse energy density of 100 mJ/cm$^2$, the internal transmittance of the silica glass having a thickness of 10 mm exceeded 99.5% with respect to light having a wavelength of 193 nm.

Further, it was confirmed that, after being irradiated with 1×10$^6$ pulses of KrF excimer laser at an average one-pulse energy density of 400 mJ/cm$^2$, the internal transmittance of the silica glass having a thickness of 10 mm exceeded 99.5% with respect to light having a wavelength of 248 nm.

When the lens designed is made for a KrF excimer laser, this optical member can be used for KrF excimer laser steppers.

A projection lens made of this optical member has a hydrogen concentration of 5×10 molecules/cm or more with a higher concentration at the center portion than the periphery.

This projection lens can be used in manufacturing lines for 256-MB VLSI.

As explained in the foregoing, the present invention can provide a silica glass in which the influence of flare and ghost caused by optical scattering is reduced so as to yield optical properties approximating the designed resolution defined at the time of designing a lens, and thus, which achieves high resolution. Further, the present invention can provide an optical member which includes this silica glass of the present invention, and thus, which achieves a favorable contrast. Also, it would be effective in improving throughput.

Therefore, the optical member including the silica glass of the present invention can be applied to projection lenses used for any of i-line, ArF, and KrF excimer laser steppers using light in the wavelength region of 400 nm or shorter. Also, in accordance with the present invention, the performance including resolution and stability of the photolithography apparatuses can be improved.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 000479/1995 (7-479) filed on Jan. 6, 1995 and 004077/1995 (7-4077) filed on Jan. 13, 1995 are hereby incorporated by reference.

What is claimed is:

1. An exposure apparatus using light in a wavelength region of 400 nm or shorter as exposure light, which comprises:
    a stage allowing a photosensitive substrate to be held on a main surface thereof;
    an illumination optical system for emitting the exposure light of a wavelength and transferring a pattern of a mask onto said substrate;
    a projection optical system provided between a surface on which the mask is disposed and said substrate, for projecting an image of the pattern of said mask onto said substrate; and
    an optical member comprising the silica glass having a structure determination temperature of 1,200 K or lower and an OH group concentration of at least 1,000 ppm.

2. An exposure apparatus according to claim 1, wherein said silica glass has a fluorine concentration of at least 300 ppm.

3. An exposure apparatus according to claim 1, wherein said illumination optical system comprises said optical member.

4. An exposure apparatus according to claim 1, wherein said projection optical system comprises said optical member.

5. A method for producing a silica glass having a structure determination temperature of 1,200 K or lower and an OH group concentration of at least 1,000 ppm, said method comprising the steps of:
    heating a silica glass having an OH group concentration of 1,000 ppm or more to a temperature of 1,200 K to 1,350 K;
    maintaining said silica glass at said temperature for a period of time; and then
    cooling said silica glass to a temperature of 1,000 K or lower at a temperature-lowering rate of 50 K/hr or less to anneal said silica glass.

6. A method according to claim 5, further comprising a step of hydrolyzing a silicon compound in an oxy-hydrogen flame to obtain fine glass particles, and depositing and melting said fine glass particles to obtain the silica glass having an OH group concentration of 1,000 ppm or more.

7. A method according to claim 6, wherein a volume ratio of oxygen gas to hydrogen gas in said flame is 0.4 or more.

8. A method according to claim 8, further comprising the steps of:
    hydrolyzing a silicon compound in an oxy-hydrogen flame to obtain fine glass particles, and depositing and melting said fine glass particles to obtain a silica glass having an OH group concentration of 1,000 ppm or more; and then
    cooling said silica glass from a temperature of at least 1,373 K to a temperature not higher than 1,073 K at a temperature-lowering rate of 50 K/hr or less to pre-anneal said silica glass.

9. A method according to claim 8, wherein a volume ratio of oxygen gas to hydrogen gas in said flame is 0.4 or more.

* * * * *

UNITED STATES PATENT AND TRADEMARK OFFICE
CERTIFICATE OF CORRECTION

PATENT NO. : 6,518,210 B1
DATED : June 27, 2003
INVENTOR(S) : Jinbo et al.

It is certified that error appears in the above-identified patent and that said Letters Patent is hereby corrected as shown below:

Column 22,
Line 4, thereof, please replace "." with -- ; wherein said silica glass has a fluorine concentration of at least 300 ppm. --;
Line 5, thereof, please delete "Claim 2";
Line 8, thereof, please replace "3" with -- 2 --;
Line 11, thereof, please replace "4" with -- 3 --;
Line 13, please insert before claim 5:
-- 4.   An exposure apparatus according to, wherein said silica glass has a scattering loss amount of 0.2 %/cm or less with respect to ArF excimer laser. --
Line 33, thereof, please replace "claim 8" with -- claim 5 --;
Line 45, please insert after claim 9:
-- 10.   A method according to claim 5, wherein said silica glass has a scattering loss amount of 0.2 %/cm or less with respect to ArF excimer laser. --

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,518,210 B1
DATED : June 27, 2003
INVENTOR(S) : Jinbo et al.

It is certified that error appears in the above-identified patent and that said Letters Patent is hereby corrected as shown below:

<u>Column 22,</u>
Line 13, please insert before Claim 5
-- 4. An exposure apparatus according to claim 1, wherein said silica glass has a scattering loss amount of 0.2 %/cm or less with respect to ArF excimer laser. --

Signed and Sealed this

Second Day of March, 2004

JON W. DUDAS
*Acting Director of the United States Patent and Trademark Office*